US008013395B2

(12) United States Patent
Kotani

(10) Patent No.: US 8,013,395 B2
(45) Date of Patent: Sep. 6, 2011

(54) SEMICONDUCTOR DEVICE AND METHOD FOR FABRICATING THE SAME

(75) Inventor: Naoki Kotani, Hyogo (JP)

(73) Assignee: Panasonic Corporation, Osaka (JP)

( * ) Notice: Subject to any disclaimer, the term of this patent is extended or adjusted under 35 U.S.C. 154(b) by 355 days.

(21) Appl. No.: 11/819,365

(22) Filed: Jun. 27, 2007

(65) Prior Publication Data

US 2008/0036013 A1    Feb. 14, 2008

(30) Foreign Application Priority Data

Aug. 11, 2006  (JP) ................................ 2006-219324

(51) Int. Cl.
*H01L 21/70* (2006.01)
*H01L 29/80* (2006.01)

(52) U.S. Cl. ........ 257/368; 257/371; 257/369; 257/274; 257/E27.046; 257/E21.632

(58) Field of Classification Search .................. 257/274, 257/371, 204, 206, 368, 369, E21.623, E21.637, 257/E27.001, E27.046, E27.064, E27.108, 257/E21.632, 202, 251, 285, E11.632; 438/154; 716/10; 365/185.05
See application file for complete search history.

(56) References Cited

U.S. PATENT DOCUMENTS

| 6,514,824 | B1 * | 2/2003 | Randazzo et al. ............. 438/283 |
| 2002/0106844 | A1 * | 8/2002 | Kotani ........................... 438/154 |
| 2004/0153986 | A1 * | 8/2004 | Sahara et al. .................. 716/10 |
| 2007/0170516 | A1 * | 7/2007 | Cecchi et al. ................. 257/371 |

FOREIGN PATENT DOCUMENTS

JP        8-17934        1/1996

* cited by examiner

*Primary Examiner* — Colleen Matthews
*Assistant Examiner* — Galina Yushina
(74) *Attorney, Agent, or Firm* — McDermott Will & Emery LLP

(57) ABSTRACT

The distance between a substrate contact portion and an active region in a p-type MIS transistor is greater than the distance between a substrate contact portion and an active region in an n-type MIS transistor. Alternatively, the length of a protruding part of a gate electrode of the p-type MIS transistor that protrudes from the p-type MIS transistor's active region toward the p-type MIS transistor's substrate contact portion is shorter than the length of a protruding part of a gate electrode of the n-type MIS transistor that protrudes from the n-type MIS transistor's active region toward the n-type MIS transistor's substrate contact portion. Alternatively, a part of the p-type MIS transistor's substrate contact portion that is located opposite the p-type MIS transistor's gate electrode has a lower impurity concentration than the other part thereof. Alternatively, a protective film is formed only on the protruding part of the p-type MIS transistor's gate electrode that protrudes from the p-type MIS transistor's active region toward the p-type MIS transistor's substrate contact portion.

18 Claims, 21 Drawing Sheets

SEMICONDUCTOR DEVICE AND METHOD FOR FABRICATING THE SAME

BACKGROUND OF THE INVENTION

1. Field of the Invention

The present invention relates to semiconductor devices and methods for fabricating the same.

2. Description of the Related Art

In recent years, design rules in the field of semiconductor devices have been reduced drastically. Conventionally, to shrink the height of standard cells, etc. in a semiconductor device, the semiconductor device has been designed with consideration given to interdiffusion occurring at the boundary between an n-type MIS transistor and a p-type MIS transistor therein (see Patent Document 1, for example).

Interdiffusion occurring due to substrate contact portions, however, has not been sufficiently considered, and the boundaries between the transistors and the substrate contact portions have been designed based on the same rules as the boundary between the n-type MIS transistor and the p-type MIS transistor.

FIG. 20A is a plan view of a conventional semiconductor device having a dual-gate structure, and FIG. 20B is a cross-sectional view taken along the line XX-XX in FIG. 20A.

As shown in FIGS. 20A and 20B, an active region 1a of an n-type MIS transistor (hereinafter referred to as the n-type MIS transistor's active region 1a) and an active region 1b of a p-type MIS transistor (hereinafter referred to as the p-type MIS transistor's active region 1b) are formed on a semiconductor substrate 1 so as to be adjacent to each other with an isolation region 2 interposed therebetween. A substrate contact portion 7 of the n-type MIS transistor (hereinafter referred to as the n-type MIS transistor's substrate contact portion 7) is formed on the semiconductor substrate 1 opposite the p-type MIS transistor's active region 1b with respect to the n-type MIS transistor's active region 1a, while a substrate contact portion 6 of the p-type MIS transistor (hereinafter referred to as the p-type MIS transistor's substrate contact portion 6) is formed on the semiconductor substrate 1 opposite the n-type MIS transistor's active region 1a with respect to the p-type MIS transistor's active region 1b. The isolation region 2 is formed also between the n-type MIS transistor's active region 1a and the n-type MIS transistor's substrate contact portion 7 and between the p-type MIS transistor's active region 1b and the p-type MIS transistor's substrate contact portion 6.

Also, as shown in FIGS. 20A and 20B, an n-type gate electrode 3, into which an n-type impurity has been introduced, is formed over the n-type MIS transistor's active region 1a, while a p-type gate electrode 4, into which a p-type impurity has been introduced, is formed on the p-type MIS transistor's active region 1b. The n-type gate electrode 3 and the p-type gate electrode 4 are connected together on the isolation region 2 located between the n-type MIS transistor's active region 1a and the p-type MIS transistor's active region 1b. An n-type doped layer (an n-type substrate contact region) 6a and an n-type doped layer 3a are formed in the respective surface portions of the p-type MIS transistor's substrate contact portion 6 and n-type gate electrode 3. A p-type doped layer (a p-type substrate contact region) 7a and a p-type doped layer 4a are formed in the respective surface portions of the n-type MIS transistor's substrate contact portion 7 and p-type gate electrode 4.

Furthermore, as shown in FIGS. 20A and 20B, an insulating sidewall spacer 5 is formed on the side walls of the n-type gate electrode 3 and p-type gate electrode 4. Also, contact areas 8 for establishing contact with upper-level interconnects and the like are formed on the n-type MIS transistor's active region 1a, the p-type MIS transistor's active region 1b, the p-type MIS transistor's substrate contact portion 6, and the n-type MIS transistor's substrate contact portion 7.

In the conventional semiconductor device shown in FIGS. 20A and 20B, the length M1 of a part of the n-type gate electrode 3 that protrudes from the n-type MIS transistor's active region 1a toward the n-type MIS transistor's substrate contact portion 7 is set equal to the length N1 of a part of the p-type gate electrode 4 that protrudes from the p-type MIS transistor's active region 1b toward the p-type MIS transistor's substrate contact portion 6.

Moreover, in fabricating the conventional semiconductor device shown in FIGS. 20A and 20B, the width M2 of a p-type substrate contact introducing area (a mask opening area) M3 that defines a region through which a p-type impurity is introduced into the n-type MIS transistor's substrate contact portion 7 is set equal to the width N2 of an n-type substrate contact introducing area (a mask opening area) N3 that defines a region through which an n-type impurity is introduced into the p-type MIS transistor's substrate contact portion 6.

Also, in fabricating the conventional semiconductor device shown in FIGS. 20A and 20B, the distance M4 from the n-type MIS transistor's active region 1a to the p-type substrate contact introducing area M3 is set equal to the distance N4 from the p-type MIS transistor's active region 1b to the n-type substrate contact introducing area N3. In other words, the distance M5 from the n-type MIS transistor's active region 1a to the n-type MIS transistor's substrate contact portion 7 is set equal to the distance N5 from the p-type MIS transistor's active region 1b to the p-type MIS transistor's substrate contact portion 6.

In the above-described conventional semiconductor device shown in FIGS. 20A and 20B, rules that allow the above-mentioned various sizes (M1, M2, M4, M5, N1, N2, N4, and N5) to be sufficiently large are used.

PATENT DOCUMENT 1

Japanese Laid-Open Publication No. 8-17934

SUMMARY OF THE INVENTION

However, the conventional structure described above has a problem in that, for example, in the downsized logic cells, the ratio of the area occupied by the substrate contact portions to the cell height is increased, such that the transistors' active regions cannot have sufficient size.

Also, if the various sizes are reduced further without considering interdiffusion caused by the substrate contact portions, another problem will occur in that the transistors' capability is decreased by such interdiffusion.

In view of the above, it is therefore an object of the present invention to provide a semiconductor device in which interdiffusion caused by substrate contact portions does not occur in the logic cells and the like and the layout of the substrate contact portions is sufficiently shrunk to thereby maximize transistors' active regions, and a method for fabricating the semiconductor device.

In order to achieve the object, a first inventive semiconductor device having a dual-gate structure includes: a first active region of an n-type MIS transistor and a second active region of a p-type MIS transistor formed on a semiconductor substrate so as to be adjacent to each other with an isolation region interposed therebetween; a first substrate contact portion of the n-type MIS transistor formed on the semiconductor substrate opposite the second active region with respect to the first active region; a second substrate contact portion of the p-type MIS transistor formed on the semiconductor substrate opposite the first active region with respect to the second active region; an n-type gate electrode formed over the first active region and containing an n-type impurity introduced thereinto; a p-type doped layer formed in the first substrate contact portion and containing a p-type impurity introduced thereinto; a p-type gate electrode formed over the second active region and containing a p-type impurity introduced thereinto; and an n-type doped layer formed in the second substrate contact portion and containing an n-type impurity introduced thereinto, wherein the distance between the second substrate contact portion and the second active region is greater than the distance between the first substrate contact portion and the first active region.

In the first inventive semiconductor device, the distance between the n-type doped layer in the p-type MIS transistor's substrate contact portion and the p-type MIS transistor's active region is greater than the distance between the p-type doped layer in the n-type MIS transistor's substrate contact portion and the n-type MIS transistor's active region. Thus, when the n-type doped layer in the p-type MIS transistor's substrate contact portion is formed, it is possible to reduce the amount of n-type impurity introduced into a part of the p-type gate electrode that protrudes from the p-type MIS transistor's active region toward the p-type MIS transistor's substrate contact portion (hereinafter referred to as the protruding part of the p-type gate electrode). In the p-type MIS transistor, therefore, the influence of interdiffusion occurring due to the substrate contact portion is eliminated. In the n-type MIS transistor, it is possible to reduce the distance between the p-type doped layer in the substrate contact portion and the active region. In other words, it is possible to sufficiently shrink the substrate contact portion in the n-type MIS transistor. Thus, even when the logic cells have a limitation on their height, for example, the transistors' active regions are of sufficient size.

In the first inventive semiconductor device, the length of a protruding part of the n-type gate electrode that protrudes from the first active region toward the first substrate contact portion may be set equal to the length of a protruding part of the p-type gate electrode that protrudes from the second active region toward the second substrate contact portion.

A first inventive method for fabricating a semiconductor device includes the steps of: (a) forming, on a semiconductor substrate, a first active region of an n-type MIS transistor, a second active region of a p-type MIS transistor, a first substrate contact portion of the n-type MIS transistor, and a second substrate contact portion of the p-type MIS transistor, the first active region and the second active region being adjacent to each other with an isolation region interposed therebetween, the first substrate contact portion being located opposite the second active region with respect to the first active region, the second substrate contact portion being located opposite the first active region with respect to the second active region; (b) forming an n-type gate electrode over the first active region and a p-type gate electrode over the second active region; (c) introducing, after the step (b), a p-type impurity into the second active region and into the first substrate contact portion, whereby p-type source/drain regions of the p-type MIS transistor are formed in the second active region and a p-type doped layer is formed in the first substrate contact portion; and (d) introducing, after the step (b), an n-type impurity into the first active region and into the second substrate contact portion, whereby n-type source/drain regions of the n-type MIS transistor are formed in the first active region and an n-type doped layer is formed in the second substrate contact portion, wherein the distance between the second active region and a mask opening area, through which the n-type impurity is introduced into the second substrate contact portion in the step (d), is set greater than the distance between the first active region and a mask opening area, through which the p-type impurity is introduced into the first substrate contact portion in the step (c).

To be specific, the first inventive semiconductor device fabrication method is a method for fabricating the above-described first inventive semiconductor device. According to the first inventive semiconductor device fabrication method, the distance between the p-type MIS transistor's active region and the mask opening area, through which the n-type impurity is introduced into the p-type MIS transistor's substrate contact portion, is set greater than the distance between the n-type MIS transistor's active region and the mask opening area, through which the p-type impurity is introduced into the n-type MIS transistor's substrate contact portion. Thus, when the n-type impurity is introduced into the p-type MIS transistor's substrate contact portion, it is possible to reduce the amount of the n-type impurity introduced into the protruding part of the p-type gate electrode. In the p-type MIS transistor, therefore, the influence of interdiffusion occurring due to the substrate contact portion is eliminated. In the n-type MIS transistor, it is possible to reduce the distance between the active region and the mask opening area, through which the p-type impurity is introduced. In other words, it is possible to sufficiently shrink the substrate contact portion in the n-type MIS transistor. Thus, even when the logic cells have a limitation on their height, for example, the transistors' active regions are of sufficient size.

In the first inventive semiconductor device fabrication method, in order to reliably achieve the above effects, in the step (a), the distance between the second substrate contact portion and the second active region is preferably greater than the distance between the first substrate contact portion and the first active region.

In the first inventive semiconductor device fabrication method, the width of the mask opening area, through which the n-type impurity is introduced into the second substrate contact portion in the step (d), is preferably set smaller than the width of the mask opening area, through which the p-type impurity is introduced into the first substrate contact portion in the step (c). Then, when the n-type impurity is introduced into the p-type MIS transistor's substrate contact portion, the amount of the n-type impurity introduced into the protruding part of the p-type gate electrode can be reduced more reliably, whereby, in the p-type MIS transistor, the influence of interdiffusion occurring due to the substrate contact portion is reliably eliminated. Furthermore, the above-described effects are attainable without making the distance between the n-type doped layer in the p-type MIS transistor's substrate contact portion and the p-type MIS transistor's active region be greater than the distance between the p-type doped layer in the n-type MIS transistor's substrate contact portion and the n-type MIS transistor's active region. That is, it is possible to sufficiently shrink not only the substrate contact portion in the n-type MIS transistor but also the substrate contact portion in the p-type MIS transistor. Thus, even when the logic cells have a limitation on their height, for example, the transistors' active regions are increased in size more sufficiently.

A second inventive semiconductor device having a dual-gate structure includes: a first active region of an n-type MIS transistor and a second active region of a p-type MIS transistor formed on a semiconductor substrate so as to be adjacent to each other with an isolation region interposed therebetween; a first substrate contact portion of the n-type MIS transistor formed on the semiconductor substrate opposite the second active region with respect to the first active region; a second substrate contact portion of the p-type MIS transistor formed on the semiconductor substrate opposite the first active region with respect to the second active region; an n-type gate electrode formed over the first active region and containing an n-type impurity introduced thereinto; a p-type doped layer formed in the first substrate contact portion and containing a p-type impurity introduced thereinto; a p-type gate electrode formed over the second active region and containing a p-type impurity introduced thereinto; and an n-type doped layer formed in the second substrate contact portion and containing an n-type impurity introduced thereinto, wherein the length of a protruding part of the p-type gate electrode that protrudes from the second active region toward the second substrate contact portion is shorter than the length of a protruding part of the n-type gate electrode that protrudes from the first active region toward the first substrate contact portion.

In the second inventive semiconductor device, the length of the protruding part of the p-type gate electrode is shorter than the length of the protruding part of the n-type gate electrode. This permits the distance between the protruding part of the p-type gate electrode and the n-type doped layer in the p-type MIS transistor's substrate contact portion to be greater than the distance between the protruding part of the n-type gate electrode and the p-type doped layer in the n-type MIS transistor's substrate contact portion. Thus, when the n-type doped layer in the p-type MIS transistor's substrate contact portion is formed, it is possible to reduce the amount of the n-type impurity introduced into the protruding part of the p-type gate electrode. In the p-type MIS transistor, therefore, the influence of interdiffusion occurring due to the substrate contact portion is eliminated. Furthermore, the above-described effects are attainable without making the distance between the n-type doped layer in the p-type MIS transistor's substrate contact portion and the p-type MIS transistor's active region be greater than the distance between the p-type doped layer in the n-type MIS transistor's substrate contact portion and the n-type MIS transistor's active region. That is, it is possible to sufficiently shrink not only the substrate contact portion in the n-type MIS transistor but also the substrate contact portion in the p-type MIS transistor. Thus, even when the logic cells have a limitation on their height, for example, the transistors' active regions are increased in size more sufficiently.

In the second inventive semiconductor device, the distance between the second substrate contact portion and the second active region may be set equal to the distance between the first substrate contact portion and the first active region.

A third inventive semiconductor device having a dual-gate structure includes: a first active region of an n-type MIS transistor and a second active region of a p-type MIS transistor formed on a semiconductor substrate so as to be adjacent to each other with an isolation region interposed therebetween; a first substrate contact portion of the n-type MIS transistor formed on the semiconductor substrate opposite the second active region with respect to the first active region; a second substrate contact portion of the p-type MIS transistor formed on the semiconductor substrate opposite the first active region with respect to the second active region; an n-type gate electrode formed over the first active region and containing an n-type impurity introduced thereinto; a p-type doped layer formed in the first substrate contact portion and containing a p-type impurity introduced thereinto; a p-type gate electrode formed over the second active region and containing a p-type impurity introduced thereinto; and an n-type doped layer formed in the second substrate contact portion and containing an n-type impurity introduced thereinto, wherein a part of the second substrate contact portion that is located opposite the p-type gate electrode has a lower impurity concentration than the other part of the second substrate contact portion.

In the third inventive semiconductor device, the part of the p-type MIS transistor's substrate contact portion that is located opposite the p-type gate electrode has a lower impurity concentration than the other part thereof. That is, in the third inventive semiconductor device, it is not necessary to introduce the n-type impurity into the part of the p-type MIS transistor's substrate contact portion that is located opposite the p-type gate electrode. Thus, when the n-type doped layer in the p-type MIS transistor's substrate contact portion is formed, it is possible to prevent the n-type impurity from being introduced into the protruding part of the p-type gate electrode. In the p-type MIS transistor, therefore, the influence of interdiffusion occurring due to the substrate contact portion is eliminated. Furthermore, since the n-type impurity is not introduced into the protruding part of the p-type gate electrode, it is possible to sufficiently shrink not only the substrate contact portion in the n-type MIS transistor but also the substrate contact portion in the p-type MIS transistor. Thus, even when the logic cells have a limitation on their height, for example, the transistors' active regions are of sufficient size.

In fabricating the third inventive semiconductor device, in the step of introducing the n-type impurity into the second substrate contact portion, a mask which covers the part of the second substrate contact portion that is located opposite the p-type gate electrode may be used.

In the third inventive semiconductor device, a part of the first substrate contact portion that is located opposite the n-type gate electrode may have a lower impurity concentration than the other part of the first substrate contact portion. In this case, in the step of introducing the n-type impurity into the second substrate contact portion, a mask which covers the part of the second substrate contact portion that is located opposite the p-type gate electrode may be used, and in the step of introducing the p-type impurity into the first substrate contact portion, a mask which covers the part of the first substrate contact portion that is located opposite the n-type gate electrode may be used.

A fourth inventive semiconductor device having a dual-gate structure includes: a first active region of an n-type MIS transistor and a second active region of a p-type MIS transistor formed on a semiconductor substrate so as to be adjacent to each other with an isolation region interposed therebetween; a first substrate contact portion of the n-type MIS transistor formed on the semiconductor substrate opposite the second active region with respect to the first active region; a second substrate contact portion of the p-type MIS transistor formed on the semiconductor substrate opposite the first active region with respect to the second active region; an n-type gate electrode formed over the first active region and containing an n-type impurity introduced thereinto; a p-type doped layer formed in the first substrate contact portion and containing a p-type impurity introduced thereinto; a p-type gate electrode formed over the second active region and containing a p-type impurity introduced thereinto; and an n-type doped layer formed in the second substrate contact portion and containing an n-type impurity introduced thereinto, wherein a protective film is formed on a protruding part of the p-type gate electrode that protrudes from the second active region toward the second substrate contact portion, and the protective film is not formed on a part of the p-type gate electrode that is located over the second active region.

In the fourth inventive semiconductor device, the protective film is formed on the protruding part of the p-type gate electrode. Thus, when the n-type doped layer in the p-type MIS transistor's substrate contact portion is formed, the n-type impurity is not introduced into the protruding part of the p-type gate electrode. In the p-type MIS transistor, therefore, the influence of interdiffusion occurring due to the substrate contact portion is eliminated. Furthermore, since the n-type impurity is not introduced into the protruding part of the p-type gate electrode, it is possible to sufficiently shrink not only the substrate contact portion in the n-type MIS transistor but also the substrate contact portion in the p-type MIS transistor. Thus, even when the logic cells have a limitation on their height, for example, the transistors' active regions are of sufficient size.

In the fourth inventive semiconductor device, the protective film may also be formed on a protruding part of the n-type gate electrode that protrudes from the first active region toward the first substrate contact portion. In this case, a sidewall spacer may be formed on the side walls of the p-type and n-type gate electrodes, and the sidewall spacer and the protective film may be formed of the same insulating film.

A second inventive method for fabricating a semiconductor device includes the steps of: (a) forming, on a semiconductor substrate, a first active region of an n-type MIS transistor, a second active region of a p-type MIS transistor, a first substrate contact portion of the n-type MIS transistor, and a second substrate contact portion of the p-type MIS transistor, the first active region and the second active region being adjacent to each other with an isolation region interposed therebetween, the first substrate contact portion being located opposite the second active region with respect to the first active region, the second substrate contact portion being located opposite the first active region with respect to the second active region; (b) forming an n-type gate electrode over the first active region and a p-type gate electrode over the second active region; (c) forming a protective film on a protruding part of the p-type gate electrode that protrudes from the second active region toward the second substrate contact portion; (d) introducing, after the step (c), a p-type impurity into the second active region and into the first substrate contact portion, whereby p-type source/drain regions of the p-type MIS transistor are formed in the second active region and a p-type doped layer is formed in the first substrate contact portion; and (e) introducing, after the step (c), an n-type impurity into the first active region and into the second substrate contact portion, whereby n-type source/drain regions of the n-type MIS transistor are formed in the first active region and an n-type doped layer is formed in the second substrate contact portion.

To be specific, the second inventive semiconductor device fabrication method is a method for fabricating the fourth inventive semiconductor device described above. According to the second inventive semiconductor device fabrication method, the protective film is formed on the protruding part of the p-type gate electrode, before the n-type impurity is introduced into the substrate contact portion of the p-type MIS transistor. Thus, when the n-type impurity is introduced into the p-type MIS transistor's substrate contact portion, the n-type impurity is not introduced into the protruding part of the p-type gate electrode. In the p-type MIS transistor, therefore, the influence of interdiffusion occurring due to the substrate contact portion is eliminated. Moreover, since the n-type impurity is not introduced into the protruding part of the p-type gate electrode, it is possible to sufficiently shrink not only the substrate contact portion in the n-type MIS transistor but also the substrate contact portion in the p-type MIS transistor. Thus, even when the logic cells have a limitation on their height, for example, the transistors' active regions are of sufficient size.

In the second inventive method, the step (c) may include the step of forming the protective film also on a protruding part of the n-type gate electrode that protrudes from the first active region toward the first substrate contact portion. In this case, the step (c) may include the steps of: forming an insulating film over the semiconductor substrate as well as over the n-type and p-type gate electrodes; etching back the insulating film by using masks which cover parts of the insulating film that are located on the protruding parts of the n-type and p-type gate electrodes, whereby a sidewall spacer is formed on the side walls of the n-type and p-type gate electrodes and the protective film is formed on the protruding parts of the n-type and p-type gate electrodes; and removing the masks.

As described above, according to the present invention, design rules for the n-type MIS transistor's substrate contact portion and design rules for the p-type MIS transistor's substrate contact portion are separately established with consideration given to interdiffusion caused by those substrate contact portions. And the substrate contact portions are formed based on those design rules. Thus, the occurrence of interdiffusion caused by the substrate contact portions is prevented in the standard cells and the like, and the layout of the substrate contact portions is sufficiently shrunk to thereby maximize the size of the transistors' active regions.

That is, the present invention, which is related to semiconductor devices and methods for fabricating the semiconductor devices, is very effective when applied to a semiconductor device having a dual-gate structure, because the present invention produces the effect that the size of the active region of each transistor in the semiconductor device is maximized without the occurrence of interdiffusion caused by the transistor's substrate contact portion.

DETAILED DESCRIPTION OF THE INVENTION

First Embodiment

Hereinafter, a semiconductor device according to a first embodiment of the present invention and a method for fabricating the semiconductor device will be described with reference to the accompanying drawings.

Figure 1A:
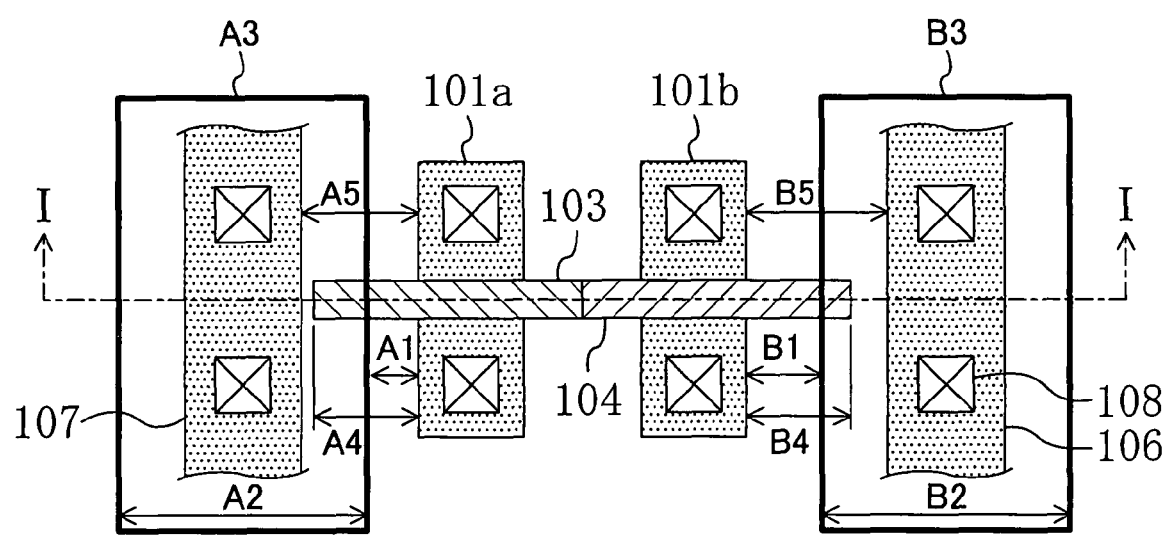
FIG. 1A is a plan view of a semiconductor device according to a first embodiment of the present invention which has a dual-gate structure.
Figure 1B:
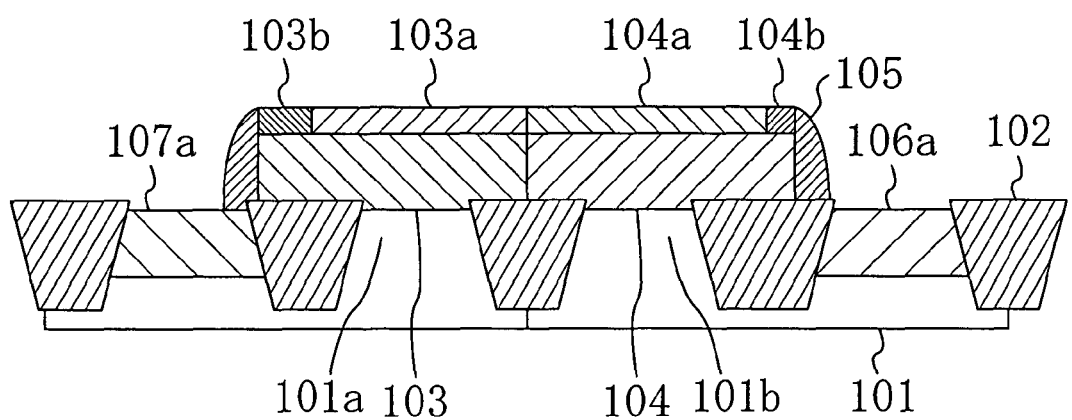
FIG. 1B is a cross-sectional view taken along the line I-I in FIG. 1A.

FIG. 1A is a plan view of the semiconductor device of the first embodiment which has a dual-gate structure, and FIG. 1B is a cross-sectional view taken along the line I-I in FIG. 1A.

As shown in FIGS. 1A and 1B, an active region 101a of an n-type MIS transistor (hereinafter referred to as the n-type MIS transistor's active region 101a) and an active region 101b of a p-type MIS transistor (hereinafter referred to as the p-type MIS transistor's active region 101b) are formed on a semiconductor substrate 101 made of silicon so as to be adjacent to each other with an isolation region 102 interposed therebetween. A substrate contact portion 107 of the n-type MIS transistor (hereinafter referred to as the n-type MIS transistor's substrate contact portion 107) is formed on the semiconductor substrate 101 opposite the p-type MIS transistor's active region 101b with respect to the n-type MIS transistor's active region 101a, while a substrate contact portion 106 of the p-type MIS transistor (hereinafter referred to as the p-type MIS transistor's substrate contact portion 106) is formed on the semiconductor substrate 101 opposite the n-type MIS transistor's active region 101a with respect to the p-type MIS transistor's active region 101b. The isolation region 102 is formed also between the n-type MIS transistor's active region 101a and the n-type MIS transistor's substrate contact portion 107 and between the p-type MIS transistor's active region 101b and the p-type MIS transistor's substrate contact portion 106.

Also, as shown in FIGS. 1A and 1B, an n-type gate electrode 103, into which an n-type impurity has been introduced, is formed over the n-type MIS transistor's active region 101a with a gate insulating film (not shown) interposed therebetween, while a p-type gate electrode 104, into which a p-type impurity has been introduced, is formed over the p-type MIS transistor's active region 101b with a gate insulating film (not shown) interposed therebetween. The n-type gate electrode 103 and the p-type gate electrode 104 are connected together on the isolation region 102 located between the n-type MIS transistor's active region 101a and the p-type MIS transistor's active region 101b. An n-type doped layer (an n-type substrate contact region) 106a and an n-type doped layer 103a are formed in the respective surface portions of the p-type MIS transistor's substrate contact portion 106 and n-type gate electrode 103. A p-type doped layer (a p-type substrate contact region) 107a and a p-type doped layer 104a are formed in the respective surface portions of the n-type MIS transistor's substrate contact portion 107 and p-type gate electrode 104.

Furthermore, as shown in FIGS. 1A and 1B, an insulating sidewall spacer 105 is formed on the side walls of the n-type gate electrode 103 and p-type gate electrode 104. Also, contact areas (contact plugs) 108 for establishing contact with upper-level interconnects and the like are formed on the n-type MIS transistor's active region 101a, the p-type MIS transistor's active region 101b, the p-type MIS transistor's substrate contact portion 106, and the n-type MIS transistor's substrate contact portion 107.

In the semiconductor device of this embodiment shown in FIGS. 1A and 1B, the length A4 of a part of the n-type gate electrode 103 that protrudes from the n-type MIS transistor's active region 101a toward the n-type MIS transistor's substrate contact portion 107 is set equal to the length B4 of a part of the p-type gate electrode 104 that protrudes from the p-type MIS transistor's active region 101b toward the p-type MIS transistor's substrate contact portion 106.

Moreover, in fabricating the semiconductor device of this embodiment shown in FIGS. 1A and 1B, the width (the p-type impurity introducing mask width) A2 of a mask opening area A3, through which a p-type impurity is introduced into the n-type MIS transistor's substrate contact portion 107, is set equal to the width (the n-type impurity introducing mask width) B2 of a mask opening area B3, through which an n-type impurity is introduced into the p-type MIS transistor's substrate contact portion 106.

Also, in fabricating the semiconductor device of this embodiment shown in FIGS. 1A and 1B, the distance B1 between the p-type MIS transistor's active region 101b and the mask opening area B3, through which an n-type impurity is introduced into the p-type MIS transistor's substrate contact portion 106, is set greater than the distance A1 between the n-type MIS transistor's active region 101a and the mask opening area A3, through which a p-type impurity is introduced into the n-type MIS transistor's substrate contact portion 107. In other words, the distance B5 from the p-type MIS transistor's active region 101b to the p-type MIS transistor's substrate contact portion 106 (the n-type doped layer 106a) is set greater than the distance A5 from the n-type MIS transistor's active region 101a to the n-type MIS transistor's substrate contact portion 107 (the p-type doped layer 107a).

In the above-described structure of this embodiment, when the n-type doped layer 106a in the p-type MIS transistor's substrate contact portion 106 is formed, it is possible to reduce the amount of n-type impurity introduced into the part of the p-type gate electrode 104 (hereinafter referred to as the protruding part of the p-type gate electrode 104) that protrudes from the p-type MIS transistor's active region 101b toward the p-type MIS transistor's substrate contact portion 106. That is, the width of an n-type doped layer 104b, which is formed in the surface portion of the protruding part of the p-type gate electrode 104 when the n-type doped layer 106a in the p-type MIS transistor's substrate contact portion 106 is formed, can be made smaller than the width of a p-type doped layer 103b, which is formed in the surface portion of the protruding part of the n-type gate electrode 103 when the p-type doped layer 107a in the n-type MIS transistor's substrate contact portion 107 is formed. In the p-type MIS transistor, therefore, the influence of interdiffusion occurring due to the substrate contact portion 106 is eliminated. In the n-type MIS transistor, it is possible to reduce the distance A5 between the p-type doped layer 107a in the substrate contact portion 107 and the active region 101a. In other words, it is possible to sufficiently shrink the substrate contact portion 107 in the n-type MIS transistor. Thus, even when the logic cells have a limitation on their height, for example, the transistors' active regions 101a and 101b are of sufficient size.

Figure 21A:
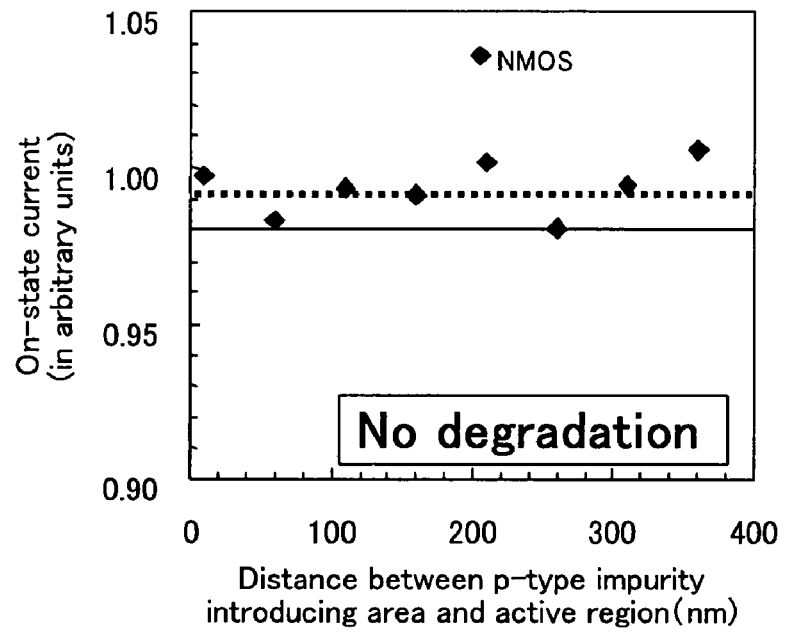
FIG. 21A shows results obtained by the present inventor by studying the dependence of on-state current on the distance between a p-type impurity introducing area and an active region in an n-type MIS transistor.
Figure 21B:
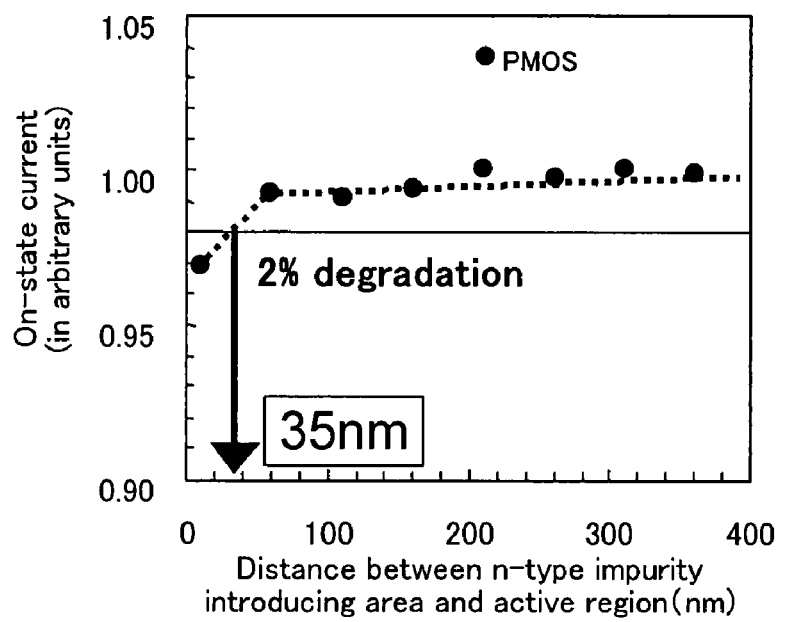
FIG. 21B shows results obtained by the present inventor by studying the dependence of on-state current on the distance between an n-type impurity introducing area and an active region in a p-type MIS transistor.

FIG. 21A indicates the dependence of on-state current on the distance A1 between the mask opening area (the p-type impurity introducing area) A3 and the active region 101a in the n-type MIS transistor (a MOS (metal-oxide semiconductor) transistor). FIG. 21B indicates the dependence of on-state current on the distance B1 between the mask opening area (the n-type impurity introducing area) B3 and the active region 101b in the p-type MIS transistor (a MOS transistor).

As shown in FIG. 21A, the influence of interdiffusion caused by the substrate contact portion 106 is hardly observed in the n-type MIS transistor. In contrast, as shown in FIG. 21B, in the p-type MIS transistor, the influence of interdiffusion caused by the substrate contact portion 107 is increased, as the n-type impurity introducing area B3 gets closer to the active region 101b, i.e., the p-type gate electrode 104; when the distance B1 between the n-type impurity introducing area B3 and the active region 101b is about 35 nm, the on-state current degrades by about 2%. This transistor capability degradation phenomenon occurring due to the interdiffusion caused by the substrate contact portion is a new problem produced by the reduced design rules. As described above, in this embodiment, since the distance B1 between the n-type impurity introducing area B3 and the active region 101b can be set to a large value, this problem can be overcome.

Now, it will be described how to fabricate a semiconductor device according to the first embodiment of the present invention. FIGS. 2A, 4A, 5A, 6A, and 7A are plan views illustrating process steps for fabricating the semiconductor device of this embodiment. FIGS. 2B, 3A to 3C, 4B, 5B, 6B, and 7B are cross-sectional views illustrating the process steps for fabricating the semiconductor device of this embodiment. FIG. 2B is a cross-sectional view taken along the line II-II in FIG. 2A. FIG. 4B is a cross-sectional view taken along the line IV-IV in FIG. 4A. FIG. 5B is a cross-sectional view taken along the line V-V in FIG. 5A. FIG. 6B is a cross-sectional view taken along the line VI-VI in FIG. 6A. FIG. 7B is a cross-sectional view taken along the line VII-VII in FIG. 7A.

Figure 2A:
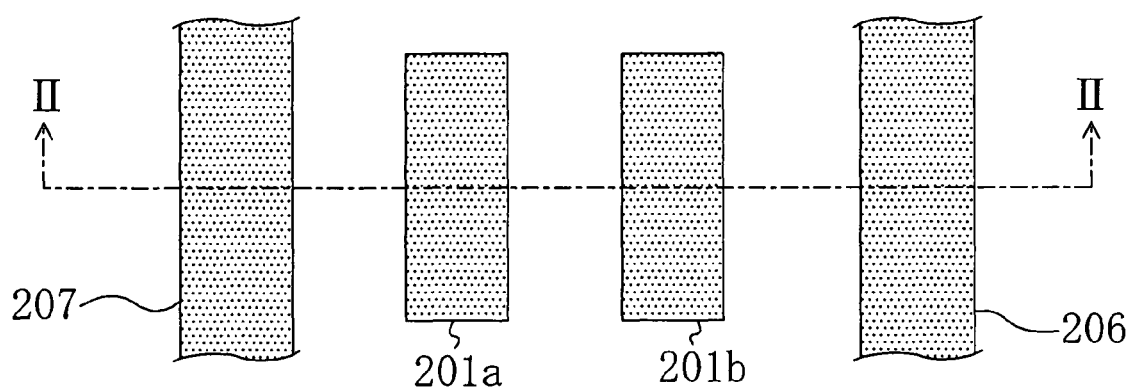
FIG. 2A is a plan view illustrating a process step for fabricating the dual-gate semiconductor device of the first embodiment of the present invention.
Figure 2B:
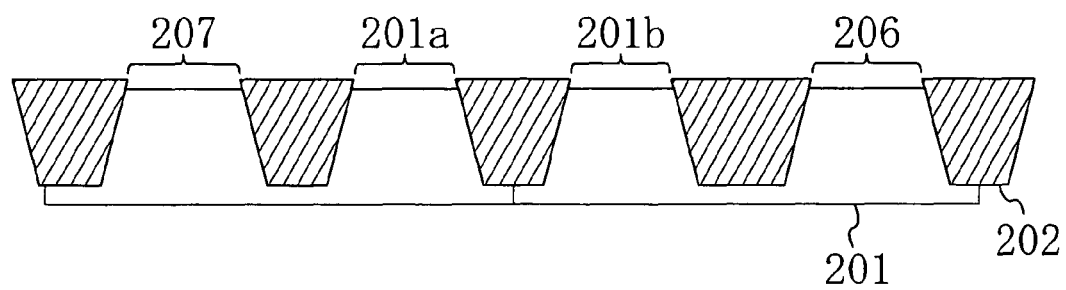
FIG. 2B is a cross-sectional view taken along the line II-II in FIG. 2A.

First, as shown in FIGS. 2A and 2B, an active region 201a of an n-type MIS transistor (hereinafter referred to as the n-type MIS transistor's active region 201a) and an active region 201b of a p-type MIS transistor (hereinafter referred to as the p-type MIS transistor's active region 201b) are formed on a semiconductor substrate 201 made of silicon so as to be adjacent to each other with an isolation region 202 interposed therebetween. A substrate contact portion 207 of the n-type MIS transistor (hereinafter referred to as the n-type MIS transistor's substrate contact portion 207) is formed on the semiconductor substrate 201 opposite the p-type MIS transistor's active region 201b with respect to the n-type MIS transistor's active region 201a, while a substrate contact portion 206 of the p-type MIS transistor (hereinafter referred to as the p-type MIS transistor's substrate contact portion 206) is formed on the semiconductor substrate 201 opposite the n-type MIS transistor's active region 201a with respect to the p-type MIS transistor's active region 201b. The isolation region 202 is formed also between the n-type MIS transistor's active region 201a and the n-type MIS transistor's substrate contact portion 207 and between the p-type MIS transistor's active region 201b and the p-type MIS transistor's substrate contact portion 206.

Figure 3A:
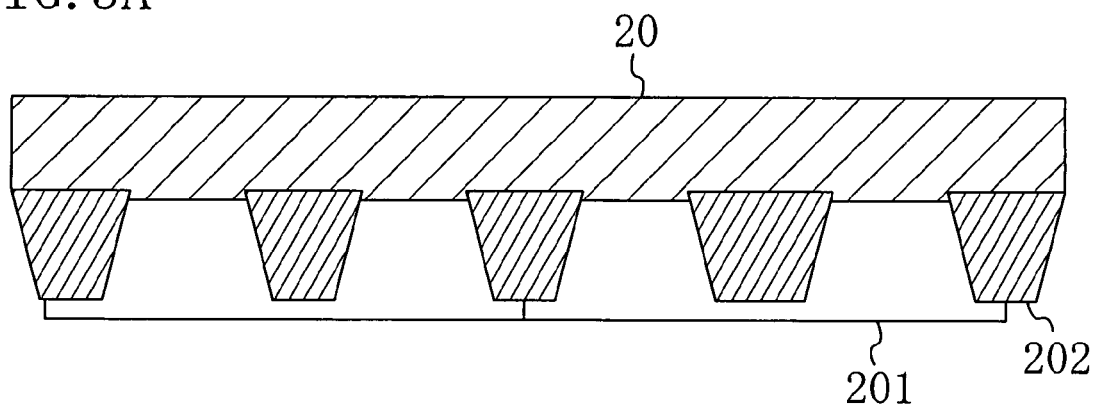
FIGS. 3A to 3C are cross-sectional views illustrating process steps for fabricating the dual-gate semiconductor device of the first embodiment of the present invention.
Figure 3B:
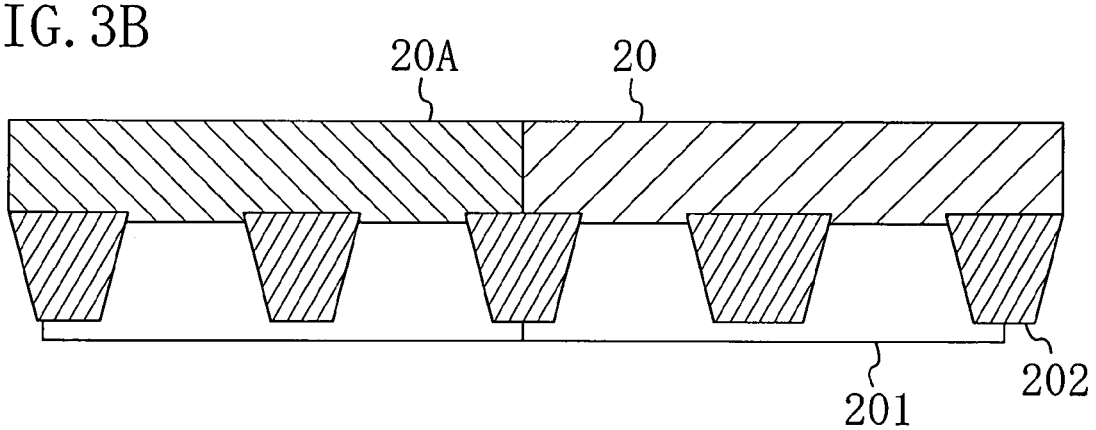
Figure 3C:
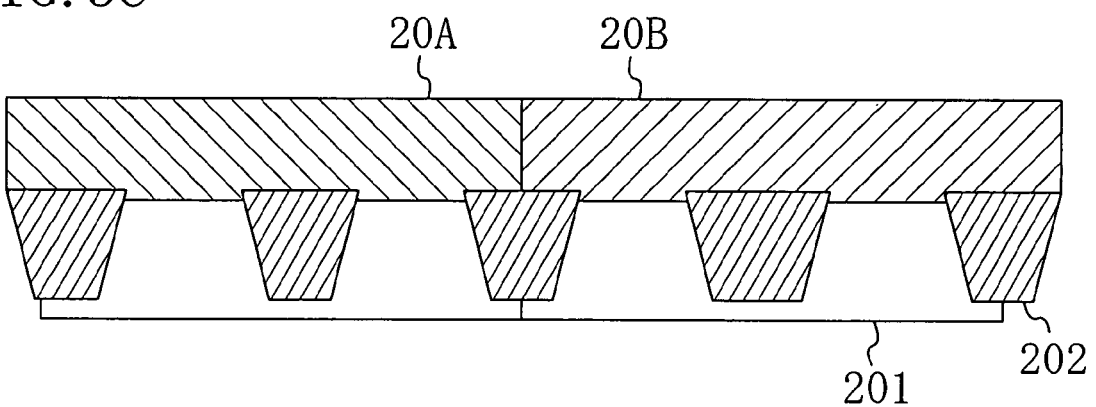

Next, as shown in FIG. 3A, a gate electrode formation conductive film 20 is formed over the semiconductor substrate 201 with a gate insulating film (not shown) interposed therebetween. Then, as shown in FIG. 3B, ions of an n-type impurity, e.g., phosphorus ions, are implanted into a part of the gate electrode formation conductive film 20 located in the n-type MIS transistor region at an acceleration voltage of 6 keV, at a dose of $6.0 \times 10^{15}$ ions/cm$^2$, and at a tilt angle of 0°, thereby forming an n-type gate electrode layer 20A. Subsequently, as shown in FIG. 3C, ions of a p-type impurity, e.g., boron ions, are implanted into a part of the gate electrode formation conductive film 20 located in the p-type MIS transistor region at an acceleration voltage of 2 keV, at a dose of $2.0 \times 10^{15}$ ions/cm$^2$, and at a tilt angle of 0°, thereby forming a p-type gate electrode layer 20B.

Figure 4A:
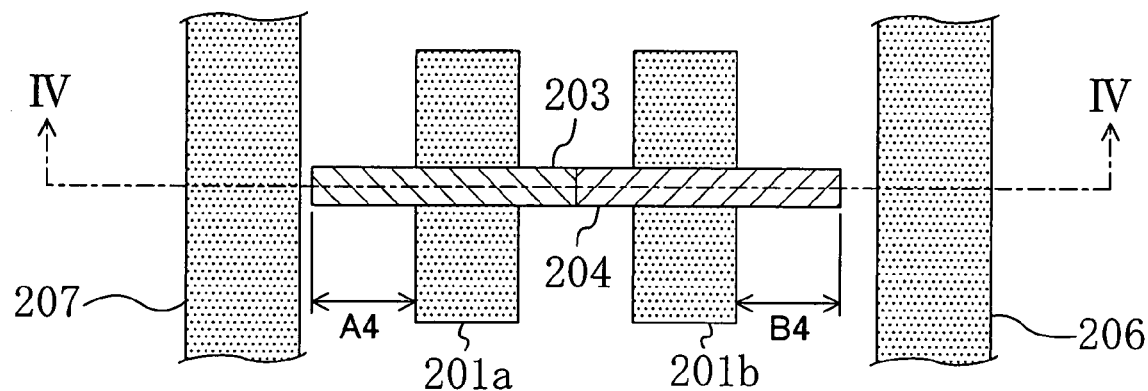
FIG. 4A is a plan view illustrating a process step for fabricating the dual-gate semiconductor device of the first embodiment of the present invention.
Figure 4B:
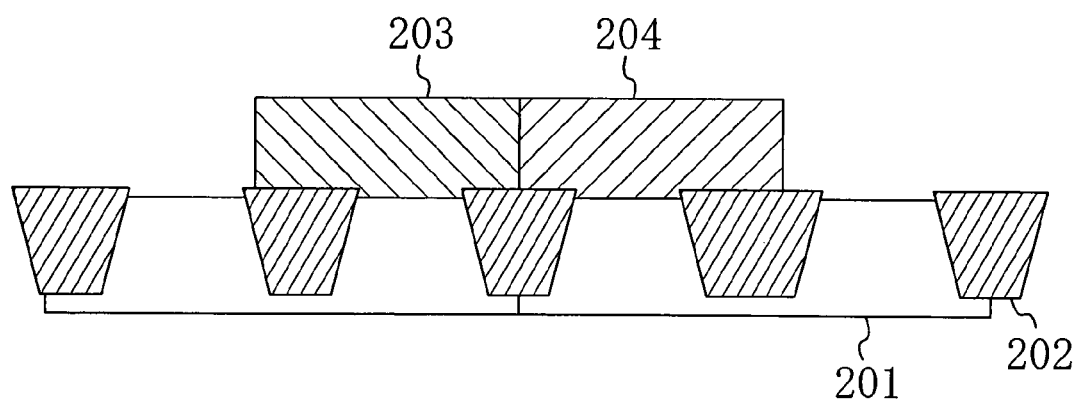
FIG. 4B is a cross-sectional view taken along the line IV-IV in FIG. 4A.
Figure 5A:
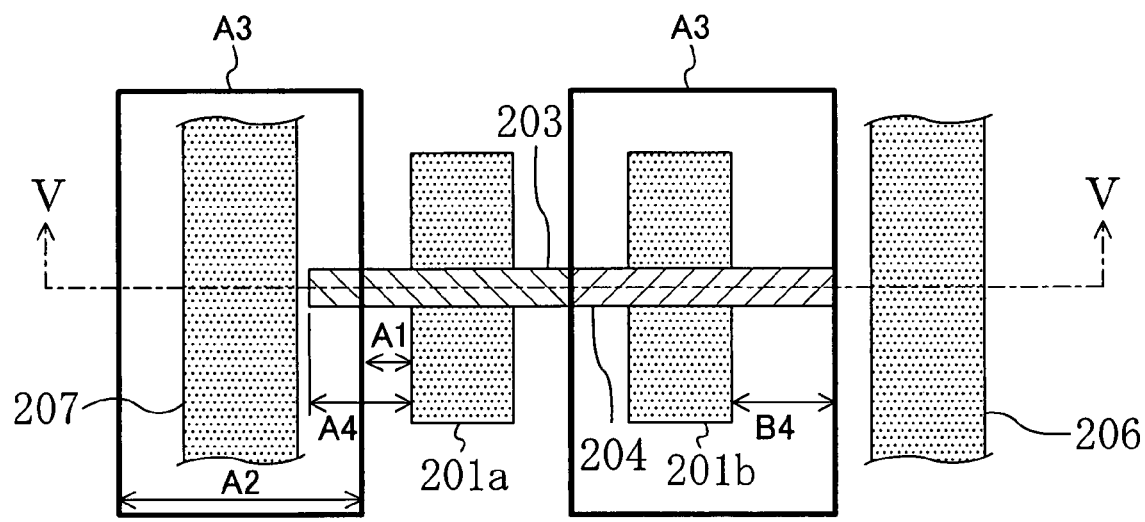
FIG. 5A is a plan view illustrating a process step for fabricating the dual-gate semiconductor device of the first embodiment of the present invention.

Next, as shown in FIGS. 4A and 4B, the n-type gate electrode layer 20A and the p-type gate electrode layer 20B are each patterned by etching, whereby an n-type gate electrode 203, into which the n-type impurity has been introduced, is formed over the n-type MIS transistor's active region 201a, and a p-type gate electrode 204, into which the p-type impurity has been introduced, is formed over the p-type MIS transistor's active region 201b. In this process step, the n-type gate electrode 203 and the p-type gate electrode 204 are formed so as to be connected together on the isolation region 202 located between the n-type MIS transistor's active region 201a and the p-type MIS transistor's active region 201b. The length A4 of a part of the n-type gate electrode 203 that protrudes from the n-type MIS transistor's active region 201a toward the n-type MIS transistor's substrate contact portion 207 is set equal to the length B4 of a part of the p-type gate electrode 204 that protrudes from the p-type MIS transistor's active region 201b toward the p-type MIS transistor's substrate contact portion 206.

Then, arsenic ions, for example, are implanted into the n-type MIS transistor's active region 201a and into the substrate contact portion 207 at an acceleration voltage of 3 keV, at a dose of $1.5 \times 10^{15}$ ions/cm$^2$, and at a tilt angle of 0°, thereby forming an n-type extension region (not shown). Next, a 4-way rotation implantation of, e.g., boron ions into the n-type MIS transistor's active region 201a and into the substrate contact portion 207 is performed at an acceleration voltage of 10 keV, at a dose of $8.0 \times 10^{12}$ ions/cm$^2$, and at a tilt angle of 25°, thereby forming a p-type pocket region (not shown). The 4-way rotation implantation is an implantation in which four implantations are sequentially performed in four orthogonal directions (hereinafter, the term "4-way rotation implantation" means this implantation).

Next, boron ions, for example, are implanted into the p-type MIS transistor's active region 201b and into the substrate contact portion 206 at an acceleration voltage of 0.5 keV, at a dose of $3.0 \times 10^{14}$ ions/cm$^2$, and at a tilt angle of 0°, thereby forming a p-type extension region (not shown). Then, a 4-way rotation implantation of, e.g., phosphorus ions into the p-type MIS transistor's active region 201b and into the substrate contact portion 206 is performed at an acceleration voltage of 30 keV, at a dose of $7.0 \times 10^{12}$ ions/cm$^2$, and at a tilt angle of 25°, thereby forming an n-type pocket region (not shown).

Figure 5B:
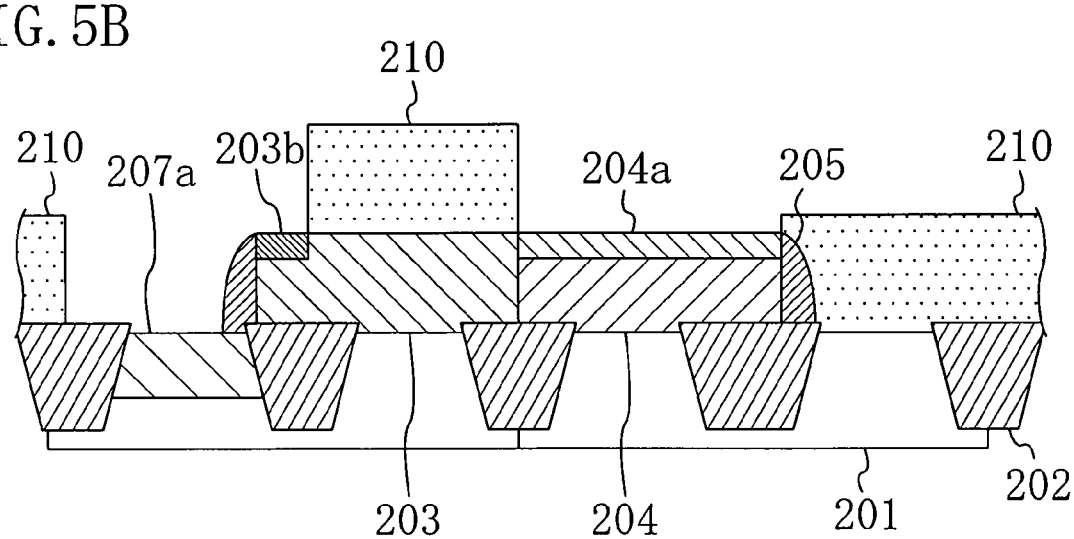
FIG. 5B is a cross-sectional view taken along the line V-V in FIG. 5A.

Subsequently, as shown in FIG. 5B, a silicon nitride film is formed over the entire surface of the semiconductor substrate 201 by an LPCVD (low pressure chemical vapor deposition) process, and then the silicon nitride film is etched by an etchback process, for example, to form a sidewall spacer 205 on the side walls of the gate electrodes 203 and 204. Next, as shown in FIGS. 5A and 5B, boron ions, for example, are implanted into the semiconductor substrate 201 at an acceleration voltage of 2 keV, at a dose of $4.0 \times 10^{15}$ ions/cm$^2$, and at a tilt angle of 7° with a resist pattern 210 used as a mask, which has opening areas (p-type impurity introducing areas) A3 located over the p-type MIS transistor's active region 201b and over the n-type MIS transistor's substrate contact portion 207. By this ion implantation, p-type source/drain regions (not shown) are formed in the p-type MIS transistor's active region 201b, while a p-type doped layer (a p-type substrate contact region) 207a is formed in the n-type MIS transistor's substrate contact portion 207. At this time, a p-type doped layer 204a is formed in the surface portion of the p-type gate electrode 204 into which a p-type impurity has been introduced, while a p-type doped layer 203b is formed in the surface portion of the protruding part of the n-type gate electrode 203 into which an n-type impurity has been introduced. In this embodiment, the width of the p-type impurity introducing area A3 located over the n-type MIS transistor's substrate contact portion 207 is set to A2, and the distance between the n-type MIS transistor's active region 201a and that p-type impurity introducing area A3 is set to A1.

Figure 6A:
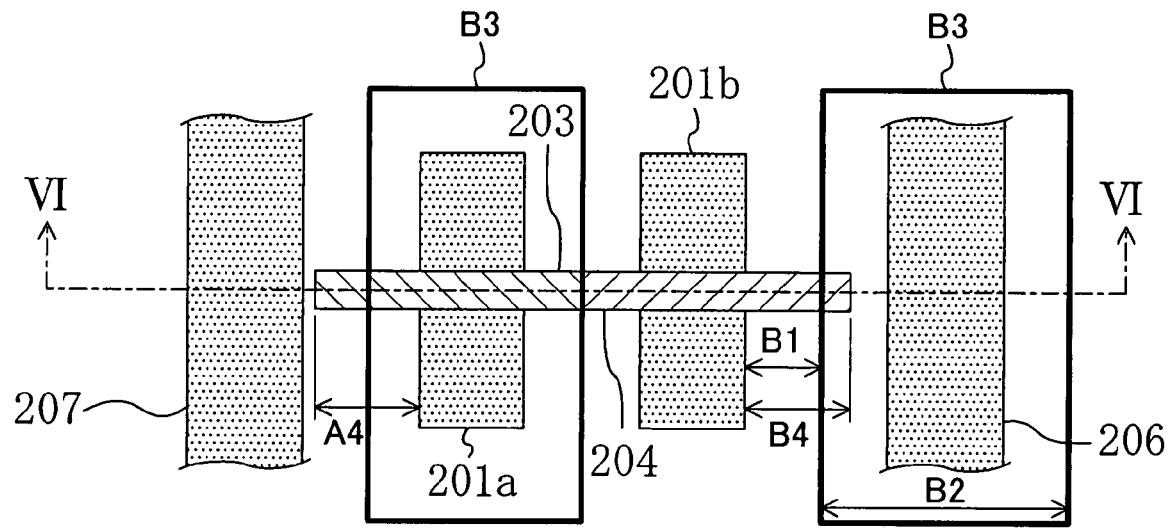
FIG. 6A is a plan view illustrating a process step for fabricating the dual-gate semiconductor device of the first embodiment of the present invention.
Figure 6B:
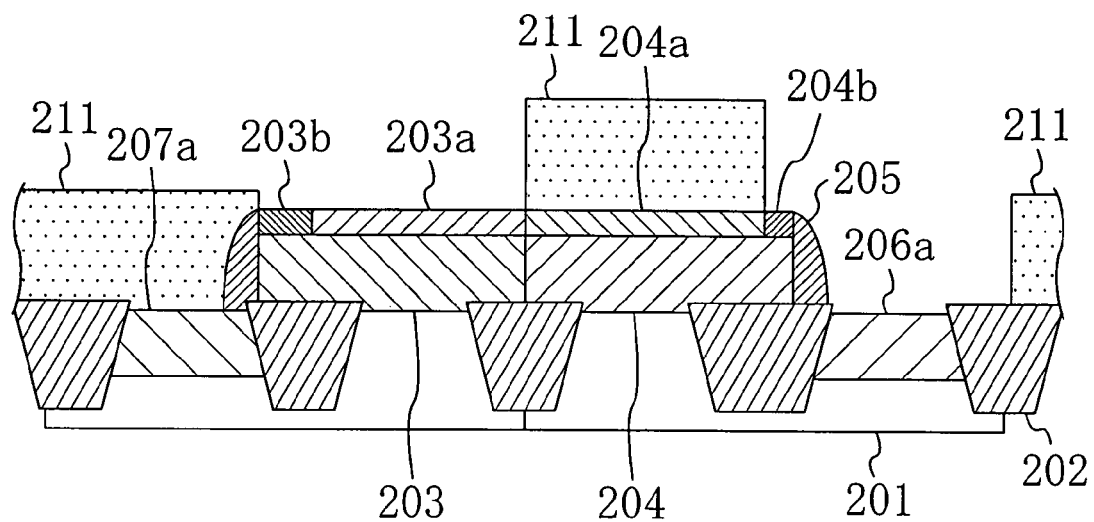
FIG. 6B is a cross-sectional view taken along the line VI-VI in FIG. 6A.

Next, the resist pattern 210 is removed, and then as shown in FIGS. 6A and 6B, arsenic ions, for example, are implanted into the semiconductor substrate 201 at an acceleration voltage of 20 keV, at a dose of $4.0 \times 10^{15}$ ions/cm$^2$, and at a tilt angle of 0° with a resist pattern 211 used as a mask, which has opening areas (n-type impurity introducing areas) B3 located over the n-type MIS transistor's active region 201a and over the p-type MIS transistor's substrate contact portion 206. Subsequently, phosphorus ions, for example, are implanted into the semiconductor substrate 201 at an acceleration voltage of 10 keV, at a dose of $1.0 \times 10^{15}$ ions/cm$^2$, and at a tilt angle of 7°. By these ion implantations, n-type source/drain regions (not shown) are formed in the n-type MIS transistor's active region 201a, while an n-type doped layer (an n-type substrate contact region) 206a is formed in the p-type MIS transistor's substrate contact portion 206. At this time, an n-type doped layer 203a is formed in the surface portion of the n-type gate electrode 203 into which an n-type impurity has been introduced, while an n-type doped layer 204b is formed in the surface portion of the protruding part of the p-type gate electrode 204 into which a p-type impurity has been introduced. In this embodiment, the width of the n-type impurity introducing area B3 located over the p-type MIS transistor's substrate contact portion 206 is set to B2, and the distance between the p-type MIS transistor's active region 201b and that n-type impurity introducing area B3 is set to B1. Furthermore, in this embodiment, the width A2 of the p-type impurity introducing area A3 is set equal to the width B2 of the n-type impurity introducing area B3, and the distance A1 (see FIG. 5) between the n-type MIS transistor's active region 201a and the p-type impurity introducing area A3 is set smaller than the distance B1 between the p-type MIS transistor's active region 201b and the n-type impurity introducing area B3. In other words, the distance B5 (the width of the isolation region 202) between the p-type MIS transistor's active region 201b and the p-type MIS transistor's substrate contact portion 206 (the n-type doped layer 206a) is set greater than the distance A5 (the width of the isolation region 202) between the n-type MIS transistor's active region 201a and the n-type MIS transistor's substrate contact portion 207 (the p-type doped layer 207a) (see FIG. 7A).

Figure 7A:
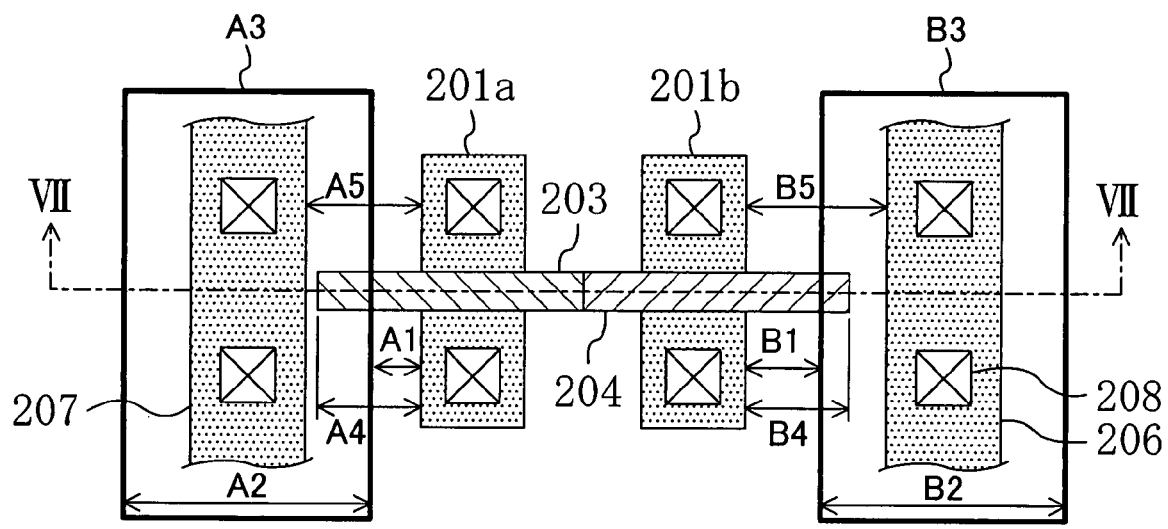
FIG. 7A is a plan view illustrating a process step for fabricating the dual-gate semiconductor device of the first embodiment of the present invention.
Figure 7B:
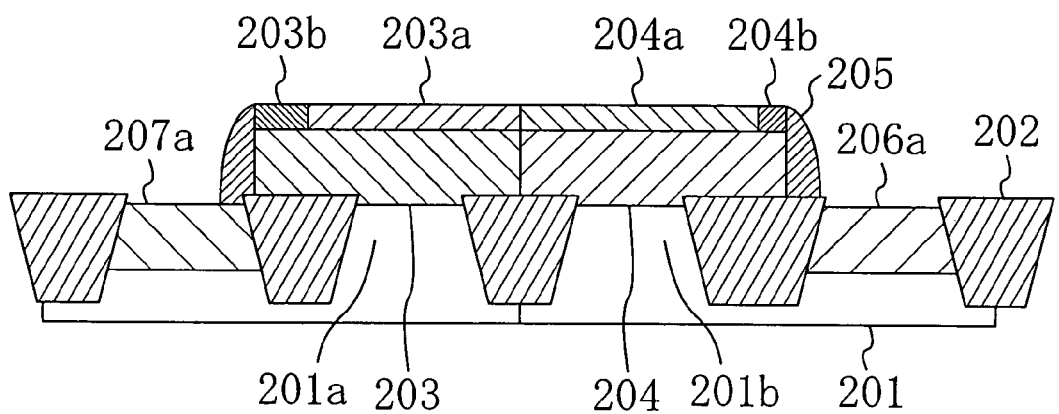
FIG. 7B is a cross-sectional view taken along the line VII-VII in FIG. 7A.

Subsequently, the resist pattern 211 is removed. Thereafter, as shown in FIGS. 7A and 7B, contact areas (contact plugs) 208 for establishing contact with upper-level interconnects and the like are formed on the n-type MIS transistor's active region 201a, the p-type MIS transistor's active region 201b, the p-type MIS transistor's substrate contact portion 206, and the n-type MIS transistor's substrate contact portion 207.

In the above-described method of this embodiment, the distance B1 between the p-type MIS transistor's active region 201b and the n-type impurity introducing area B3, through which the n-type impurities are introduced into the p-type MIS transistor's substrate contact portion 206, is set greater than the distance A1 between the n-type MIS transistor's active region 201a and the p-type impurity introducing area A3, through which the p-type impurity is introduced into the n-type MIS transistor's substrate contact portion 207. Thus, when the n-type impurities are introduced into the p-type MIS transistor's substrate contact portion 206, it is possible to reduce the amount of the n-type impurities introduced into the protruding part of the p-type gate electrode 204. That is, the n-type doped layer 204b, which is formed in the surface portion of the protruding part of the p-type gate electrode 204 when the n-type doped layer 206a in the p-type MIS transistor's substrate contact portion 206 is formed, can be made smaller than the p-type doped layer 203b, which is formed in the surface portion of the protruding part of the n-type gate electrode 203 when the p-type doped layer 207a in the n-type MIS transistor's substrate contact portion 207 is formed. In the p-type MIS transistor, therefore, the influence of interdiffusion occurring due to the substrate contact portion 206 is eliminated. In the n-type MIS transistor, it is possible to reduce the distance A1 between the p-type impurity introducing area A3 and the active region 201a. In other words, in the n-type MIS transistor, it is possible to sufficiently shrink the substrate contact portion 207. Thus, even when the logic cells have a limitation on their height, for example, the transistors' active regions 201a and 201b are of sufficient size.

Second Embodiment

Hereinafter, a semiconductor device according to a second embodiment of the present invention and a method for fabricating the semiconductor device will be described with reference to the accompanying drawings.

Figure 8A:
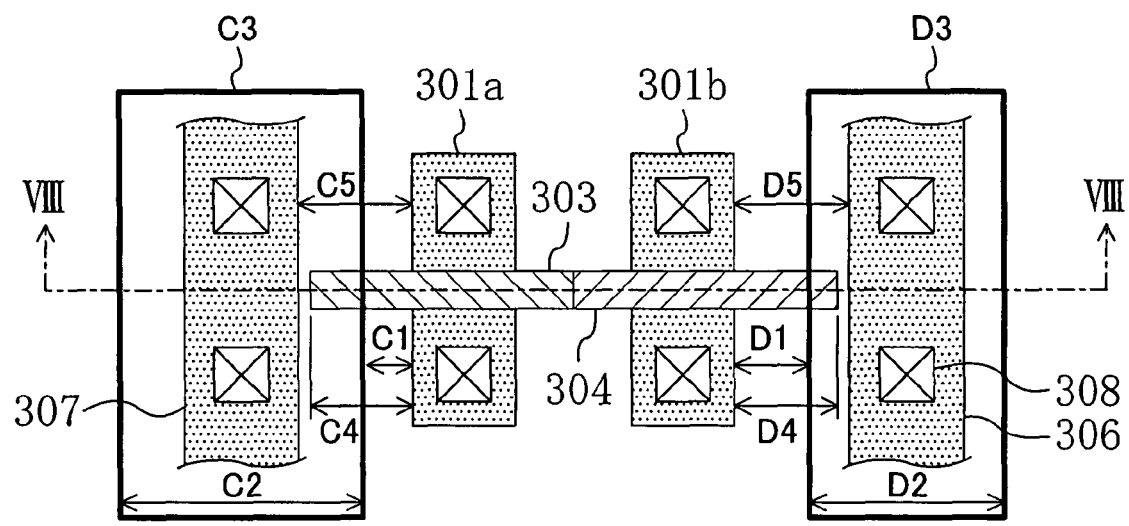
FIG. 8A is a plan view of a semiconductor device according to a second embodiment of the present invention which has a dual-gate structure.
Figure 8B:
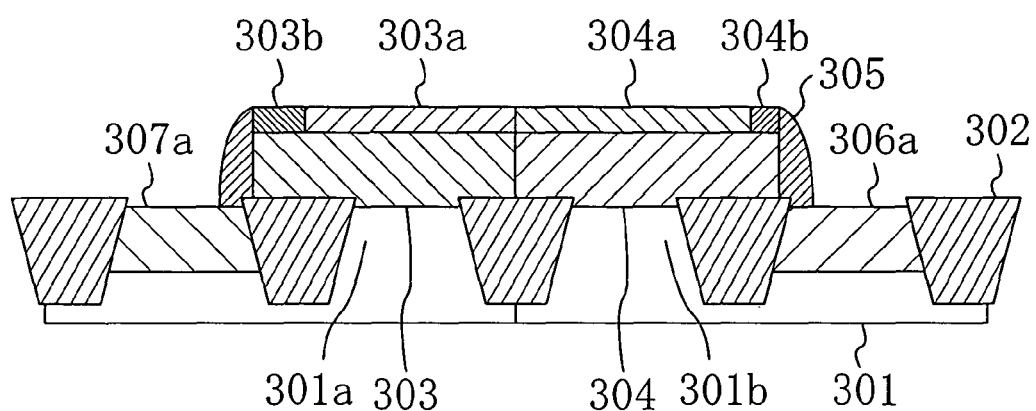
FIG. 8B is a cross-sectional view taken along the line VIII-VIII in FIG. 8A.

FIG. 8A is a plan view of the semiconductor device of the second embodiment which has a dual-gate structure, and FIG. 8B is a cross-sectional view taken along the line VIII-VIII in FIG. 8A.

As shown in FIGS. 8A and 8B, an active region 301a of an n-type MIS transistor (hereinafter referred to as the n-type MIS transistor's active region 301a) and an active region 301b of a p-type MIS transistor (hereinafter referred to as the p-type MIS transistor's active region 301b) are provided on a semiconductor substrate 301 made of silicon so as to be adjacent to each other with an isolation region 302 interposed therebetween. A substrate contact portion 307 of the n-type MIS transistor (hereinafter referred to as the n-type MIS transistor's substrate contact portion 307) is provided on the semiconductor substrate 301 opposite the p-type MIS transistor's active region 301b with respect to the n-type MIS transistor's active region 301a, while a substrate contact portion 306 of the p-type MIS transistor (hereinafter referred to as the p-type MIS transistor's substrate contact portion 306) is provided on the semiconductor substrate 301 opposite the n-type MIS transistor's active region 301a with respect to the p-type MIS transistor's active region 301b. The isolation region 302 is formed also between the n-type MIS transistor's active region 301a and the n-type MIS transistor's substrate contact portion 307 and between the p-type MIS transistor's active region 301b and the p-type MIS transistor's substrate contact portion 306.

Also, as shown in FIGS. 8A and 8B, an n-type gate electrode 303, into which an n-type impurity has been introduced, is formed over the n-type MIS transistor's active region 301a with a gate insulating film (not shown) interposed therebetween, while a p-type gate electrode 304, into which a p-type impurity has been introduced, is formed over the p-type MIS transistor's active region 301b with a gate insulating film (not shown) interposed therebetween. The n-type gate electrode 303 and the p-type gate electrode 304 are connected together on the isolation region 302 located between the n-type MIS transistor's active region 301a and the p-type MIS transistor's active region 301b. An n-type doped layer (an n-type substrate contact region) 306a and an n-type doped layer 303a are formed in the respective surface portions of the p-type MIS transistor's substrate contact portion 306 and n-type gate electrode 303. A p-type doped layer (a p-type substrate contact region) 307a and a p-type doped layer 304a are formed in the respective surface portions of the n-type MIS transistor's substrate contact portion 307 and p-type gate electrode 304.

Furthermore, as shown in FIGS. 8A and 8B, an insulating sidewall spacer 305 is formed on the side walls of the n-type gate electrode 303 and p-type gate electrode 304. Also, contact areas 308 for establishing contact with upper-level interconnects and the like are provided on the n-type MIS transistor's active region 301a, the p-type MIS transistor's active region 301b, the p-type MIS transistor's substrate contact portion 306, and the n-type MIS transistor's substrate contact portion 307.

In the semiconductor device of this embodiment shown in FIGS. 8A and 8B, the length C4 of a part of the n-type gate electrode 303 that protrudes from the n-type MIS transistor's active region 301a toward the n-type MIS transistor's substrate contact portion 307 is set equal to the length D4 of a part of the p-type gate electrode 304 that protrudes from the p-type MIS transistor's active region 301b toward the p-type MIS transistor's substrate contact portion 306.

Also, in fabricating the semiconductor device of this embodiment shown in FIGS. 8A and 8B, the width (the n-type impurity introducing mask width) D2 of a mask opening area D3, through which an n-type impurity is introduced into the p-type MIS transistor's substrate contact portion 306, is set smaller than the width (the p-type impurity introducing mask width) C2 of a mask opening area C3, through which a p-type impurity is introduced into the n-type MIS transistor's substrate contact portion 307.

Also, in fabricating the semiconductor device of this embodiment shown in FIGS. 8A and 8B, the distance D1 between the p-type MIS transistor's active region 301b and the mask opening area D3, through which an n-type impurity is introduced into the p-type MIS transistor's substrate contact portion 306, is set greater than the distance C1 between the n-type MIS transistor's active region 301a and the mask opening area C3, through which a p-type impurity is introduced into the n-type MIS transistor's substrate contact portion 307. In this embodiment, since the n-type impurity introducing mask width D2 is set smaller than the p-type impurity introducing mask width C2, the distance D5 from the p-type MIS transistor's active region 301b to the p-type MIS transistor's substrate contact portion 306 (the n-type doped layer 306a) does not need to be set greater than the distance C5 from the n-type MIS transistor's active region 301a to the n-type MIS transistor's substrate contact portion 307 (the p-type doped layer 307a).

In this embodiment, the distance D1 between the p-type MIS transistor's active region 301b and the n-type impurity introducing area D3, through which an n-type impurity is introduced into the p-type MIS transistor's substrate contact portion 306, is set greater than the distance C1 between the n-type MIS transistor's active region 301a and the p-type impurity introducing area C3, through which a p-type impurity is introduced into the n-type MIS transistor's substrate contact portion 307. Thus, when an n-type impurity is introduced into the p-type MIS transistor's substrate contact portion 306, it is possible to reduce the amount of the n-type impurity that is introduced into the protruding part of the p-type gate electrode 304. That is, the width of an n-type doped layer 304b, which is formed in the surface portion of the protruding part of the p-type gate electrode 304 when the n-type doped layer 306a in the p-type MIS transistor's substrate contact portion 306 is formed, can be made smaller than the width of a p-type doped layer 306b, which is formed in the surface portion of the protruding part of the n-type gate electrode 303 when the p-type doped layer 307a in the n-type MIS transistor's substrate contact portion 307 is formed. In the p-type MIS transistor, therefore, the influence of interdiffusion occurring due to the substrate contact portion 306 is eliminated.

In this embodiment, in the n-type MIS transistor, the distance C1 between the p-type impurity introducing area C3 and the active region 301a can be made small. In other words, in the n-type MIS transistor, it is possible to sufficiently shrink the substrate contact portion 307. Also, in this embodiment, since the n-type impurity introducing mask width D2 is set smaller than the p-type impurity introducing mask width C2, the distance (the width of the isolation region 302) between the p-type MIS transistor's substrate contact portion 306 (the n-type doped layer 306a) and the p-type MIS transistor's active region 301b does not need to be set greater than the distance (the width of the isolation region 302) between the n-type MIS transistor's substrate contact portion 307 (the p-type doped layer 307a) and the n-type MIS transistor's active region 301a. It is therefore possible to sufficiently shrink not only the n-type MIS transistor's substrate contact portion 307 but also the p-type MIS transistor's substrate contact portion 306. Thus, even when the logic cells have a limitation on their height, for example, the transistors' active regions 301a and 301b are of sufficient size.

Third Embodiment

Hereinafter, a semiconductor device according to a third embodiment of the present invention and a method for fabricating the semiconductor device will be described with reference to the accompanying drawings.

Figure 9A:
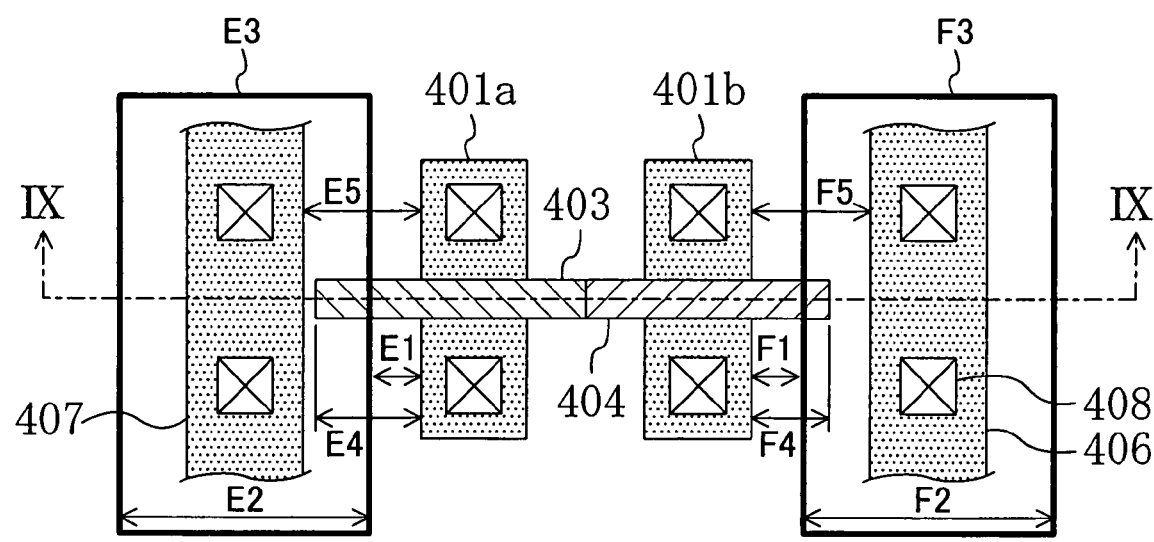
FIG. 9A is a plan view of a semiconductor device according to a third embodiment of the present invention which has a dual-gate structure.
Figure 9B:
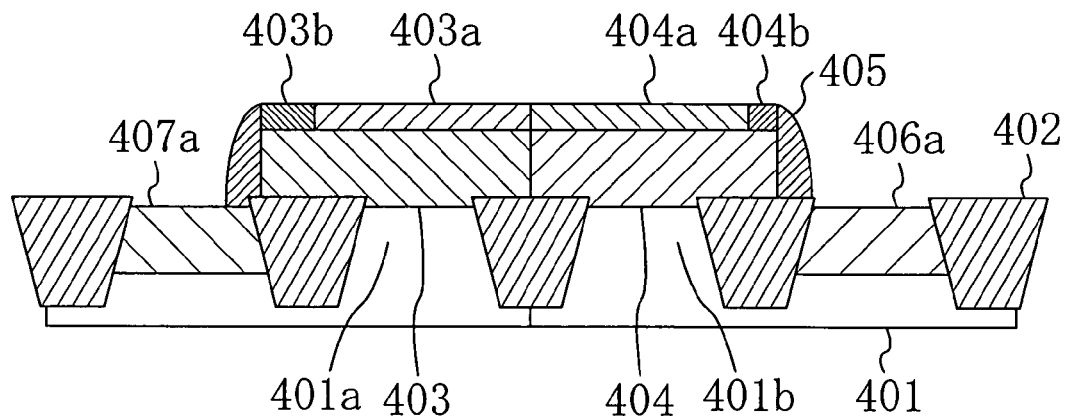
FIG. 9B is a cross-sectional view taken along the line IX-IX in FIG. 9A.

FIG. 9A is a plan view of the semiconductor device of the third embodiment which has a dual-gate structure, and FIG. 9B is a cross-sectional view taken along the line IX-IX in FIG. 9A.

As shown in FIGS. 9A and 9B, an active region 401a of an n-type MIS transistor (hereinafter referred to as the n-type MIS transistor's active region 401a) and an active region 401b of a p-type MIS transistor (hereinafter referred to as the p-type MIS transistor's active region 401b) are provided on a semiconductor substrate 401 made of silicon so as to be adjacent to each other with an isolation region 402 interposed therebetween. A substrate contact portion 407 of the n-type MIS transistor (hereinafter referred to as the n-type MIS transistor's substrate contact portion 407) is provided on the semiconductor substrate 401 opposite the p-type MIS transistor's active region 401b with respect to the n-type MIS transistor's active region 401a, while a substrate contact portion 406 of the p-type MIS transistor (hereinafter referred to as the p-type MIS transistor's substrate contact portion 406) is provided on the semiconductor substrate 401 opposite the n-type MIS transistor's active region 401a with respect to the p-type MIS transistor's active region 401b. The isolation region 402 is formed also between the n-type MIS transistor's active region 401a and the n-type MIS transistor's substrate contact portion 407 and between the p-type MIS transistor's active region 401b and the p-type MIS transistor's substrate contact portion 406.

Also, as shown in FIGS. 9A and 9B, an n-type gate electrode 403, into which an n-type impurity has been introduced, is formed over the n-type MIS transistor's active region 401a with a gate insulating film (not shown) interposed therebetween, while a p-type gate electrode 404, into which a p-type impurity has been introduced, is formed over the p-type MIS transistor's active region 401b with a gate insulating film (not shown) interposed therebetween. The n-type gate electrode 403 and the p-type gate electrode 404 are connected together on the isolation region 402 located between the n-type MIS transistor's active region 401a and the p-type MIS transistor's active region 401b. An n-type doped layer (an n-type substrate contact region) 406a and an n-type doped layer 403a are formed in the respective surface portions of the p-type MIS transistor's substrate contact portion 406 and n-type gate electrode 403. A p-type doped layer (a p-type substrate contact region) 407a and a p-type doped layer 404a are formed in the respective surface portions of the n-type MIS transistor's substrate contact portion 407 and p-type gate electrode 404.

Furthermore, as shown in FIGS. 9A and 9B, an insulating sidewall spacer 405 is formed on the side walls of the n-type gate electrode 403 and p-type gate electrode 404. Also, contact areas (contact plugs) 408 for establishing contact with upper-level interconnects and the like are provided on the n-type MIS transistor's active region 401a, the p-type MIS transistor's active region 401b, the p-type MIS transistor's substrate contact portion 406, and the n-type MIS transistor's substrate contact portion 407.

In the semiconductor device of this embodiment shown in FIGS. 9A and 9B, the length F4 of a part of the p-type gate electrode 404 that protrudes from the p-type MIS transistor's active region 401b toward the p-type MIS transistor's substrate contact portion 406 is set shorter than the length E4 of a part of the n-type gate electrode 403 that protrudes from the n-type MIS transistor's active region 401a toward the n-type MIS transistor's substrate contact portion 407.

Also, in fabricating the semiconductor device of this embodiment shown in FIGS. 9A and 9B, the width (the p-type impurity introducing mask width) E2 of a mask opening area E3, through which a p-type impurity is introduced into the n-type MIS transistor's substrate contact portion 407, is set equal to the width (the n-type impurity introducing mask width) F2 of a mask opening area F3, through which an n-type impurity is introduced into the p-type MIS transistor's substrate contact portion 406. It should however be noted that the n-type impurity introducing mask width F2 may be set smaller than the p-type impurity introducing mask width E2.

Furthermore, in fabricating the semiconductor device of this embodiment shown in FIGS. 9A and 9B, the distance E1 between the n-type MIS transistor's active region 401a and the mask opening area E3, through which a p-type impurity is introduced into the n-type MIS transistor's substrate contact portion 407, is set equal to the distance F1 between the p-type MIS transistor's active region 401b and the mask opening area F3, through which an n-type impurity is introduced into the p-type MIS transistor's substrate contact portion 406. In other words, the distance E5 from the n-type MIS transistor's active region 401a to the n-type MIS transistor's substrate contact portion 407 (the p-type doped layer 407a) is set equal to the distance F5 from the p-type MIS transistor's active region 401b to the p-type MIS transistor's substrate contact portion 406 (the n-type doped layer 406a). It should, however, be noted that the distance F1, i.e., the distance F5 may be set greater than the distance E1, i.e., the distance E5.

In this embodiment, the length of the protruding part of the p-type gate electrode 404 is shorter than the length of the protruding part of the n-type gate electrode 403. This allows the distance between the protruding part of the p-type gate electrode 404 and the p-type MIS transistor's substrate contact portion 406 (the n-type doped layer 406a) to be set greater than the distance between the protruding part of the n-type gate electrode 403 and the n-type MIS transistor's substrate contact portion 407 (the p-type doped layer 407a). Thus, when the n-type doped layer 406a in the p-type MIS transistor's substrate contact portion 406 is formed, it is possible to reduce the amount of n-type impurity that is introduced into the protruding part of the p-type gate electrode 404. That is, an n-type doped layer 404b, which is formed in the surface portion of the protruding part of the p-type gate electrode 404 when the n-type doped layer 406a in the p-type MIS transistor's substrate contact portion 406 is formed, can be made smaller than a p-type doped layer 403b, which is formed in the surface portion of the protruding part of the n-type gate electrode 403 when the p-type doped layer 407a in the n-type MIS transistor's substrate contact portion 407 is formed. In the p-type MIS transistor, therefore, the influence of interdiffusion occurring due to the substrate contact portion 406 is eliminated.

Also, in this embodiment, since the length of the protruding part of the p-type gate electrode 404 is made shorter than the length of the protruding part of the n-type gate electrode 403, the above-described effects are attainable without making the distance F5 between the p-type MIS transistor's substrate contact portion 406 (the n-type doped layer 406a) and the p-type MIS transistor's active region 401b be greater than the distance E5 between the n-type MIS transistor's substrate contact portion 407 (the p-type doped layer 407a) and the n-type MIS transistor's active region 401a. It is therefore possible to sufficiently shrink not only the n-type MIS transistor's substrate contact portion 407 but also the p-type MIS transistor's substrate contact portion 406. Thus, even when the logic cells have a limitation on their height, for example, the transistors' active regions 401a and 401b are of sufficient size.

Fourth Embodiment

Hereinafter, a semiconductor device according to a fourth embodiment of the present invention and a method for fabricating the semiconductor device will be described with reference to the accompanying drawings.

Figure 10A:
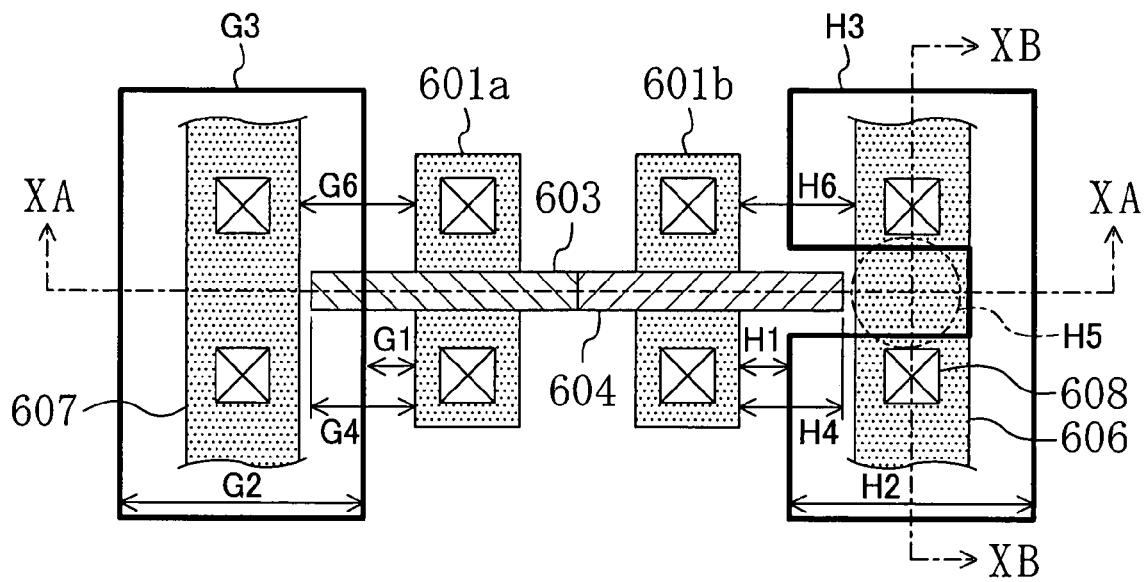
FIG. 10A is a plan view of a semiconductor device according to a fourth embodiment of the present invention which has a dual-gate structure.
Figure 10B:
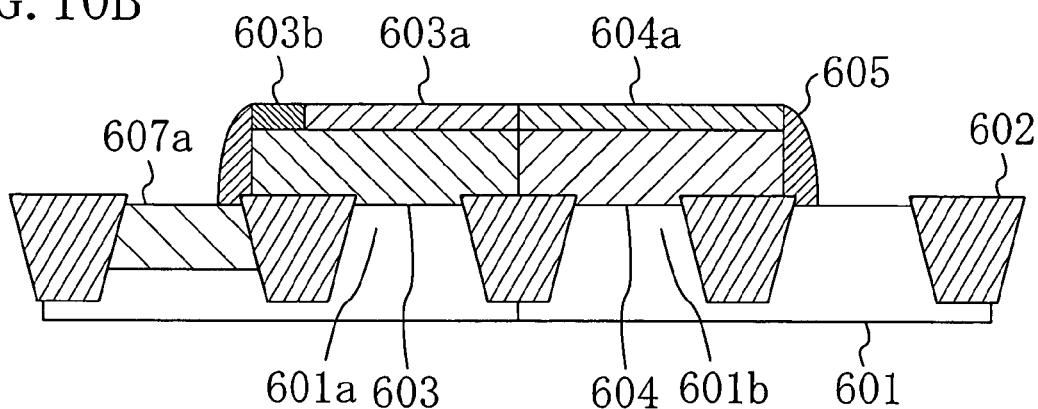
FIG. 10B is a cross-sectional view taken along the line XA-XA in FIG. 10A.
Figure 10C:
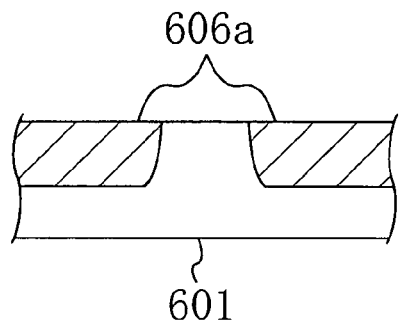
FIG. 10C is a cross-sectional view taken along the line XB-XB in FIG. 10A.

FIG. 10A is a plan view of the semiconductor device of the fourth embodiment which has a dual-gate structure. FIG. 10B is a cross-sectional view taken along the line XA-XA in FIG. 10A, and FIG. 10C is a cross-sectional view taken along the line XB-XB in FIG. 10A. In FIG. 10C, the illustration of contact areas is omitted.

As shown in FIGS. 10A to 10C, an active region 601a of an n-type MIS transistor (hereinafter referred to as the n-type MIS transistor's active region 601a) and an active region 601b of a p-type MIS transistor (hereinafter referred to as the p-type MIS transistor's active region 601b) are provided on a semiconductor substrate 601 made of silicon so as to be adjacent to each other with an isolation region 602 interposed therebetween. A substrate contact portion 607 of the n-type MIS transistor (hereinafter referred to as the n-type MIS transistor's substrate contact portion 607) is provided on the semiconductor substrate 601 opposite the p-type MIS transistor's active region 601b with respect to the n-type MIS transistor's active region 601a, while a substrate contact portion 606 of the p-type MIS transistor (hereinafter referred to as the p-type MIS transistor's substrate contact portion 606) is provided on the semiconductor substrate 601 opposite the n-type MIS transistor's active region 601a with respect to the p-type MIS transistor's active region 601b. The isolation region 602 is formed also between the n-type MIS transistor's active region 601a and the n-type MIS transistor's substrate contact portion 607 and between the p-type MIS transistor's active region 601b and the p-type MIS transistor's substrate contact portion 606.

Also, as shown in FIGS. 10A to 10C, an n-type gate electrode 603, into which an n-type impurity has been introduced, is formed over the n-type MIS transistor's active region 601a with a gate insulating film (not shown) interposed therebetween, while a p-type gate electrode 604, into which a p-type impurity has been introduced, is formed over the p-type MIS transistor's active region 601b with a gate insulating film (not shown) interposed therebetween. The n-type gate electrode 603 and the p-type gate electrode 604 are connected together on the isolation region 602 located between the n-type MIS transistor's active region 601a and the p-type MIS transistor's active region 601b. An n-type doped layer (an n-type substrate contact region) 606a and an n-type doped layer 603a are formed in the respective surface portions of the p-type MIS transistor's substrate contact portion 606 and n-type gate electrode 603. A p-type doped layer (a p-type substrate contact region) 607a and a p-type doped layer 604a are formed in the respective surface portions of the n-type MIS transistor's substrate contact portion 607 and p-type gate electrode 604.

In this embodiment, in a part (an area H5 shown in FIG. 10A) of the p-type MIS transistor's substrate contact portion 606 that is opposite the p-type gate electrode 604, the n-type substrate contact region 606a is not formed, or an n-type doped layer having a lower impurity concentration than the n-type substrate contact region 606a formed in the other part of the substrate contact portion 606 is formed.

Furthermore, as shown in FIGS. 10A to 10C, an insulating sidewall spacer 605 is formed on the side walls of the n-type gate electrode 603 and p-type gate electrode 604. Also, contact areas (contact plugs) 608 for establishing contact with upper-level interconnects and the like are provided on the n-type MIS transistor's active region 601a, the p-type MIS transistor's active region 601b, the p-type MIS transistor's substrate contact portion 606, and the n-type MIS transistor's substrate contact portion 607.

In the semiconductor device of this embodiment shown in FIGS. 10A to 10C, the length G4 of a part of the n-type gate electrode 603 that protrudes from the n-type MIS transistor's active region 601a toward the n-type MIS transistor's substrate contact portion 607 is set equal to the length H4 of a part of the p-type gate electrode 604 that protrudes from the p-type MIS transistor's active region 601b toward the p-type MIS transistor's substrate contact portion 606.

Also, in fabricating the semiconductor device of this embodiment shown in FIGS. 10A to 10C, the width (the p-type impurity introducing mask width) G2 of a mask opening area G3, through which a p-type impurity is introduced into the n-type MIS transistor's substrate contact portion 607, is set equal to the width (the n-type impurity introducing mask width) H2 of a mask opening area H3, through which an n-type impurity is introduced into the p-type MIS transistor's substrate contact portion 606. However, the relationship in terms of size between the p-type impurity introducing mask width G2 and the n-type impurity introducing mask width H2 may be set freely.

In this embodiment, the mask opening area H3, through which an n-type impurity is introduced into the p-type MIS transistor's substrate contact portion 606, is not provided for the protruding part of the p-type gate electrode 604 and for the part (the area H5 shown in FIG. 10A) of the substrate contact portion 606 that is opposite the p-type gate electrode 604. In other words, a mask that covers those parts is used in the process step in which an n-type impurity is introduced into the p-type MIS transistor's substrate contact portion 606. The mask opening area H3 may have a shape having a recess (see FIG. 10A) over those parts. Alternatively, the mask opening area H3 may be divided where it is located over those parts. This prevents the n-type impurity from being introduced into the protruding part of the p-type gate electrode 604. The n-type impurity introduced into the substrate contact portion 606 other than the part thereof that is located opposite the p-type gate electrode 604 may be caused to diffuse into that part located opposite the p-type gate electrode 604 by an annealing process performed after the impurity introduction.

Furthermore, in fabricating the semiconductor device of this embodiment shown in FIGS. 10A to 10C, the distance G1 between the n-type MIS transistor's active region 601a and the mask opening area G3, through which a p-type impurity is introduced into the n-type MIS transistor's substrate contact portion 607, is set equal to the distance H1 between the p-type MIS transistor's active region 601b and the mask opening area H3, through which an n-type impurity is introduced into the p-type MIS transistor's substrate contact portion 606. In other words, the distance G6 from the n-type MIS transistor's active region 601a to the n-type MIS transistor's substrate contact portion 607 (the p-type doped layer 607a) is set equal to the distance H6 from the p-type MIS transistor's active region 601b to the p-type MIS transistor's substrate contact portion 606 (the n-type doped layer 606a). It should, however, be noted that the relationship in terms of size between the distance G1, (i.e., the distance G6) and the distance H1, (i.e., the distance H6) may be set freely.

In this embodiment, the part of the p-type MIS transistor's substrate contact portion 606 that is located opposite the p-type gate electrode 604 has a lower impurity concentration than the other part thereof. That is, in this embodiment, it is not necessary to introduce an n-type impurity into the part of the p-type MIS transistor's substrate contact portion 606 that is located opposite the p-type gate electrode 604. Thus, when the n-type doped layer 606a in the p-type MIS transistor's substrate contact portion 606 is formed, it is possible to prevent the n-type impurity from being introduced into the protruding part of the p-type gate electrode 604. In the p-type MIS transistor, therefore, the influence of interdiffusion occurring due to the substrate contact portion 606 is eliminated. Furthermore, since the impurity of the opposite conductivity type is not introduced into the protruding part of the p-type gate electrode 604, it is possible to sufficiently shrink not only the n-type MIS transistor's substrate contact portion 607 but also the p-type MIS transistor's substrate contact portion 606. Thus, even when the logic cells have a limitation on their height, for example, the transistors' active regions are of sufficient size.

Fifth Embodiment

Hereinafter, a semiconductor device according to a fifth embodiment of the present invention and a method for fabricating the semiconductor device will be described with reference to the accompanying drawings.

Figure 11A:
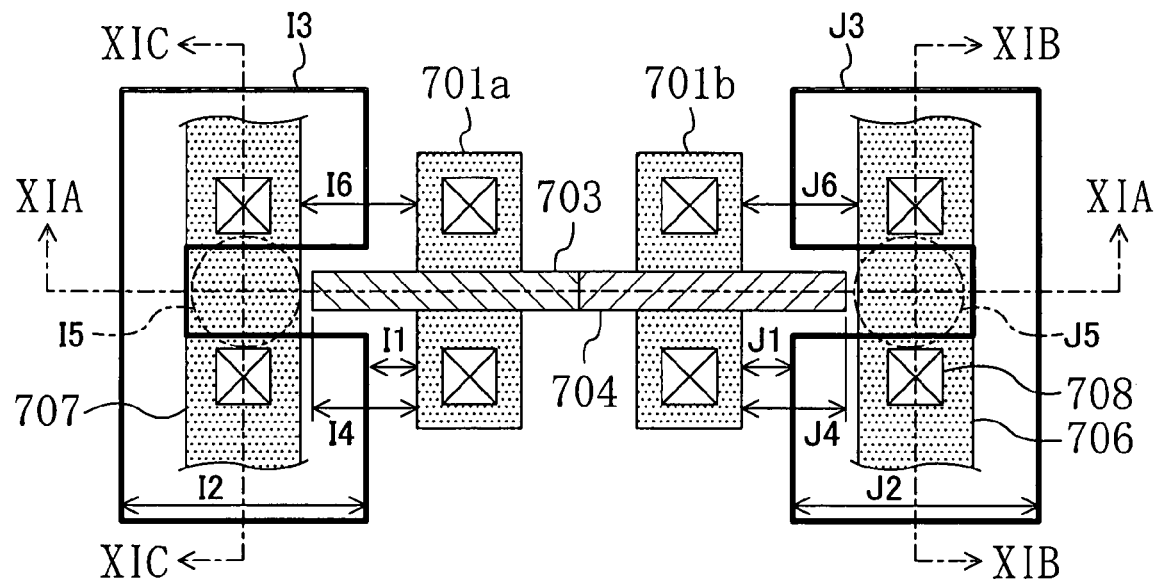
FIG. 11A is a plan view of a semiconductor device according to a fifth embodiment of the present invention which has a dual-gate structure.
Figure 11B:
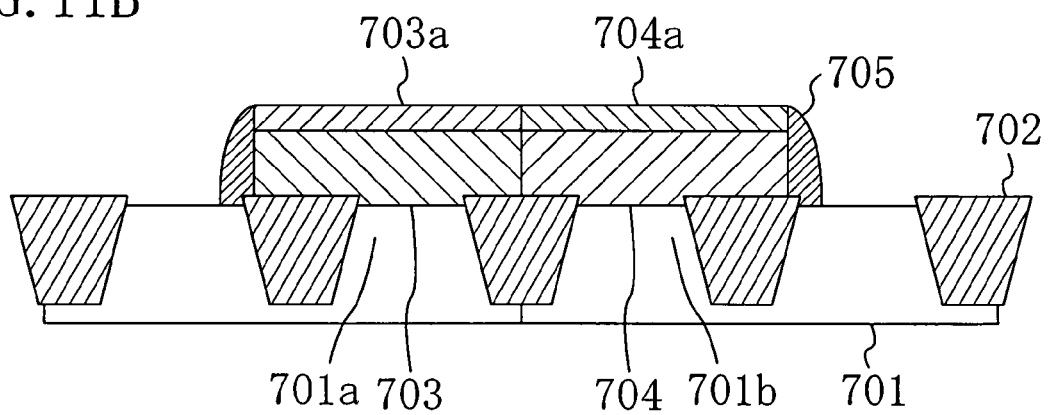
FIG. 11B is a cross-sectional view taken along the line XIA-XIA in FIG. 11A.
Figure 11C:
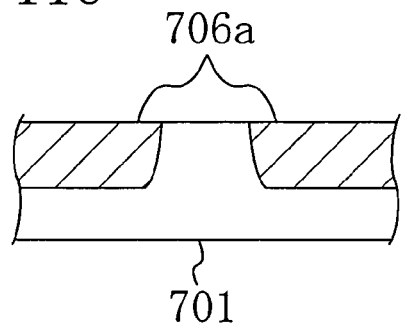
FIG. 11C is a cross-sectional view taken along the line XIB-XIB in FIG. 11A.
Figure 11D:
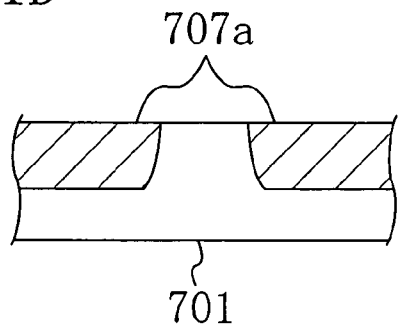
FIG. 11D is a cross-sectional view taken along the line XIC-XIC in FIG. 11A.

FIG. 11A is a plan view of the semiconductor device of the fifth embodiment which has a dual-gate structure. FIG. 11B is a cross-sectional view taken along the line XIA-XIA in FIG. 11A, FIG. 11C is a cross-sectional view taken along the line XIB-XIB in FIG. 11A, and FIG. 11D is a cross-sectional view taken along the line XIC-XIC in FIG. 11A. In FIGS. 11C and 11D, the illustration of contact areas is omitted.

As shown in FIGS. 11A to 11D, an active region 701a of an n-type MIS transistor (hereinafter referred to as the n-type MIS transistor's active region 701a) and an active region 701b of a p-type MIS transistor (hereinafter referred to as the p-type MIS transistor's active region 701b) are provided on a semiconductor substrate 701 made of silicon so as to be adjacent to each other with an isolation region 702 interposed therebetween. A substrate contact portion 707 of the n-type MIS transistor (hereinafter referred to as the n-type MIS transistor's substrate contact portion 707) is provided on the semiconductor substrate 701 opposite the p-type MIS transistor's active region 701b with respect to the n-type MIS transistor's active region 701a, while a substrate contact portion 706 of the p-type MIS transistor (hereinafter referred to as the p-type MIS transistor's substrate contact portion 706) is provided on the semiconductor substrate 701 opposite the n-type MIS transistor's active region 701a with respect to the p-type MIS transistor's active region 701b. The isolation region 702 is formed also between the n-type MIS transistor's active region 701a and the n-type MIS transistor's substrate contact portion 707 and between the p-type MIS transistor's active region 701b and the p-type MIS transistor's substrate contact portion 706.

Also, as shown in FIGS. 11A to 11D, an n-type gate electrode 703, into which an n-type impurity has been introduced, is formed over the n-type MIS transistor's active region 701a with a gate insulating film (not shown) interposed therebetween, while a p-type gate electrode 704, into which a p-type impurity has been introduced, is formed over the p-type MIS transistor's active region 701b with a gate insulating film (not shown) interposed therebetween. The n-type gate electrode 703 and the p-type gate electrode 704 are connected together on the isolation region 702 located between the n-type MIS transistor's active region 701a and the p-type MIS transistor's active region 701b. An n-type doped layer (an n-type substrate contact region) 706a and an n-type doped layer 703a are formed in the respective surface portions of the p-type MIS transistor's substrate contact portion 706 and n-type gate electrode 703. A p-type doped layer (a p-type substrate contact region) 707a and a p-type doped layer 704a are formed in the respective surface portions of the n-type MIS transistor's substrate contact portion 707 and p-type gate electrode 704.

In this embodiment, in a part (an area J5 shown in FIG. 11A) of the p-type MIS transistor's substrate contact portion 706 that is opposite the p-type gate electrode 704, the n-type substrate contact region 706a is not formed, or an n-type doped layer having a lower impurity concentration than the n-type substrate contact region 706a formed in the other part of the substrate contact portion 706 is formed.

Also, in this embodiment, in a part (an area I5 shown in FIG. 11A) of the n-type MIS transistor's substrate contact portion 707 that is opposite the n-type gate electrode 703, the p-type substrate contact region 707a is not formed, or a p-type doped layer having a lower impurity concentration than the p-type substrate contact region 707a formed in the other part of the substrate contact portion 707 is formed.

Furthermore, as shown in FIGS. 11A to 11D, an insulating sidewall spacer 705 is formed on the side walls of the n-type gate electrode 703 and p-type gate electrode 704. Also, contact areas 708 for establishing contact with upper-level interconnects and the like are provided on the n-type MIS transistor's active region 701a, the p-type MIS transistor's active region 701b, the p-type MIS transistor's substrate contact portion 706, and the n-type MIS transistor's substrate contact portion 707.

In the semiconductor device of this embodiment shown in FIGS. 11A to 11D, the length I4 of a part of the n-type gate electrode 703 that protrudes from the n-type MIS transistor's active region 701a toward the n-type MIS transistor's substrate contact portion 707 is set equal to the length J4 of a part of the p-type gate electrode 704 that protrudes from the p-type MIS transistor's active region 701b toward the p-type MIS transistor's substrate contact portion 706.

Also, in fabricating the semiconductor device of this embodiment shown in FIGS. 11A to 11D, the width (the p-type impurity introducing mask width) I2 of a mask opening area I3, through which a p-type impurity is introduced into the n-type MIS transistor's substrate contact portion 707, is set equal to the width (the n-type impurity introducing mask width) J2 of a mask opening area J3, through which an n-type impurity is introduced into the p-type MIS transistor's substrate contact portion 706. However, the relationship in terms of size between the p-type impurity introducing mask width I2 and the n-type impurity introducing mask width J2 may be set freely.

In this embodiment, the mask opening area I3, through which a p-type impurity is introduced into the n-type MIS transistor's substrate contact portion 707, is not provided for the protruding part of the n-type gate electrode 703 and for the part (the area I5 shown in FIG. 11A) of the substrate contact portion 707 that is opposite the n-type gate electrode 703. In other words, a mask that covers those parts is used in the process step in which a p-type impurity is introduced into the n-type MIS transistor's substrate contact portion 707. The mask opening area I3 may have a shape having a recess (see FIG. 11A) over those parts. Alternatively, the mask opening area I3 may be divided where it is located over those parts. This prevents the p-type impurity from being introduced into the protruding part of the n-type gate electrode 703. The p-type impurity introduced into the substrate contact portion 707 other than the part thereof that is located opposite the n-type gate electrode 703 may be caused to diffuse into that part located opposite the n-type gate electrode 703 by an annealing process performed after the impurity introduction.

Also, in this embodiment, the mask opening area J3, through which an n-type impurity is introduced into the p-type MIS transistor's substrate contact portion 706, is not provided for the protruding part of the p-type gate electrode 704 and for the part (the area J5 shown in FIG. 11A) of the substrate contact portion 706 that is opposite the p-type gate electrode 704. In other words, a mask that covers those parts is used in the process step in which an n-type impurity is introduced into the p-type MIS transistor's substrate contact portion 706. The mask opening area J3 may have a shape having a recess (see FIG. 11A) over those parts. Alternatively, the mask opening area J3 may be divided where it is located over those parts. This prevents the n-type impurity from being introduced into the protruding part of the p-type gate electrode 704. Also, the n-type impurity introduced into the substrate contact portion 706 other than the part thereof that is located opposite the p-type gate electrode 704 may be caused to diffuse into that part located opposite the p-type gate electrode 704 by an annealing process after the impurity introduction.

Furthermore, in fabricating the semiconductor device of this embodiment shown in FIGS. 11A to 11D, the distance I1 between the n-type MIS transistor's active region 701a and the mask opening area I3, through which a p-type impurity is introduced into the n-type MIS transistor's substrate contact portion 707, is set equal to the distance J1 between the p-type MIS transistor's active region 701b and the mask opening area J3, through which an n-type impurity is introduced into the p-type MIS transistor's substrate contact portion 706. In other words, the distance I6 from the n-type MIS transistor's active region 701a to the n-type MIS transistor's substrate contact portion 707 (the p-type doped layer 707a) is set equal to the distance J6 from the p-type MIS transistor's active region 701b to the p-type MIS transistor's substrate contact portion 706 (the n-type doped layer 706a). It should, however, be noted that the relationship in terms of size between the distance I1, (i.e., the distance I6) and the distance J1, (i.e., the distance J6) may be set freely.

In this embodiment, the part of the p-type MIS transistor's substrate contact portion 706 that is located opposite the p-type gate electrode 704 has a lower impurity concentration than the other part thereof. That is, in this embodiment, it is not necessary to introduce an n-type impurity into the part of the p-type MIS transistor's substrate contact portion 706 that is located opposite the p-type gate electrode 704. Thus, when the n-type doped layer 706a in the p-type MIS transistor's substrate contact portion 706 is formed, the n-type impurity is prevented from being introduced into the protruding part of the p-type gate electrode 704. In the p-type MIS transistor, therefore, the influence of interdiffusion occurring due to the substrate contact portion 706 is eliminated.

Furthermore, in this embodiment, it is not necessary to introduce a p-type impurity into the part of the n-type MIS transistor's substrate contact portion 707 that is located opposite the n-type gate electrode 703. Thus, when the p-type doped layer 707a in the n-type MIS transistor's substrate contact portion 707 is formed, the p-type impurity is prevented from being introduced into the protruding part of the n-type gate electrode 703. That is, in this embodiment, the impurity of the opposite conductivity type is not introduced into each of the n-type and p-type gate electrodes 703 and 704. It is therefore possible to sufficiently shrink not only the n-type MIS transistor's substrate contact portion 707 but also the p-type MIS transistor's substrate contact portion 706. Thus, even when the logic cells have a limitation on their height, for example, the transistors' active regions are of sufficient size.

Sixth Embodiment

Hereinafter, a semiconductor device according to a sixth embodiment of the present invention and a method for fabricating the semiconductor device will be described with reference to the accompanying drawings.

Figure 12A:
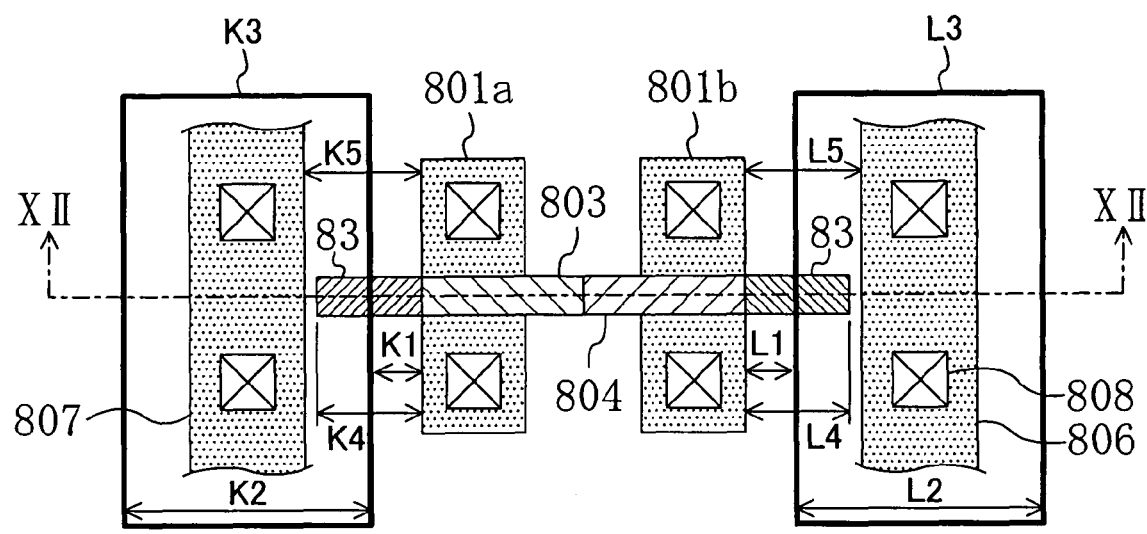
FIG. 12A is a plan view of a semiconductor device according to a sixth embodiment of the present invention which has a dual-gate structure.
Figure 12B:
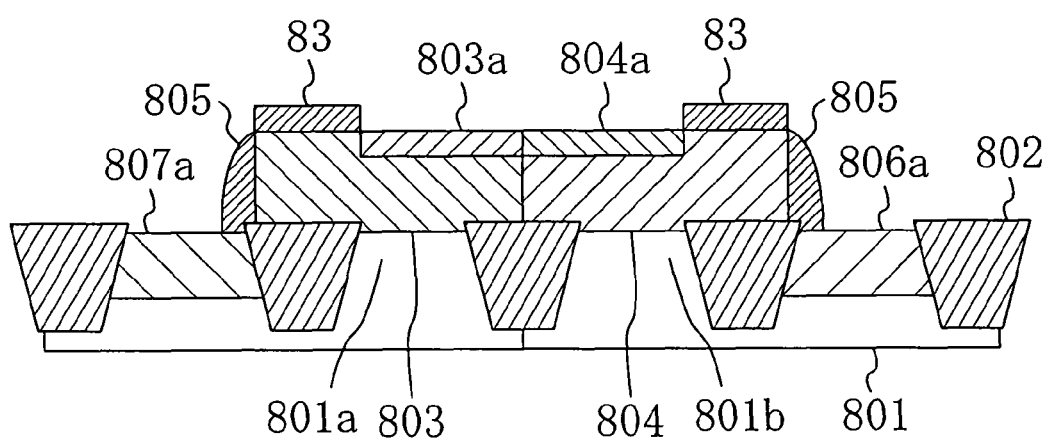
FIG. 12B is a cross-sectional view taken along the line XII-XII in FIG. 12A.

FIG. 12A is a plan view of the semiconductor device of the sixth embodiment which has a dual-gate structure, and FIG. 12B is a cross-sectional view taken along the line XII-XII in FIG. 12A.

As shown in FIGS. 12A and 12B, an active region 801a of an n-type MIS transistor (hereinafter referred to as the n-type MIS transistor's active region 801a) and an active region 801b of a p-type MIS transistor (hereinafter referred to as the p-type MIS transistor's active region 801b) are provided on a semiconductor substrate 801 made of silicon so as to be adjacent to each other with an isolation region 802 interposed therebetween. A substrate contact portion 807 of the n-type MIS transistor (hereinafter referred to as the n-type MIS transistor's substrate contact portion 807) is provided on the semiconductor substrate 801 opposite the p-type MIS transistor's active region 801b with respect to the n-type MIS transistor's active region 801a, while a substrate contact portion 806 of the p-type MIS transistor (hereinafter referred to as the p-type MIS transistor's substrate contact portion 806) is provided on the semiconductor substrate 801 opposite the n-type MIS transistor's active region 801a with respect to the p-type MIS transistor's active region 801b. The isolation region 802 is formed also between the n-type MIS transistor's active region 801a and the n-type MIS transistor's substrate contact portion 807 and between the p-type MIS transistor's active region 801b and the p-type MIS transistor's substrate contact portion 806.

Also, as shown in FIGS. 12A and 12B, an n-type gate electrode 803, into which an n-type impurity has been introduced, is formed over the n-type MIS transistor's active region 801a with a gate insulating film (not shown) interposed therebetween, while a p-type gate electrode 804, into which a p-type impurity has been introduced, is formed over the p-type MIS transistor's active region 801b with a gate insulating film (not shown) interposed therebetween. The n-type gate electrode 803 and the p-type gate electrode 804 are connected together on the isolation region 802 located between the n-type MIS transistor's active region 801a and the p-type MIS transistor's active region 801b.

In this embodiment, a protective film 83, which is made of a silicon nitride film grown for the formation of a sidewall spacer, for example, is formed on a part of the n-type gate electrode 803 that protrudes from the n-type MIS transistor's active region 801a toward the n-type MIS transistor's substrate contact portion 807. Likewise, a protective film 83 is formed on a part of the p-type gate electrode 804 that protrudes from the p-type MIS transistor's active region 801b toward the p-type MIS transistor's substrate contact portion 806.

Also, as shown in FIGS. 12A and 12B, an n-type doped layer (an n-type substrate contact region) 806a is formed in the surface portion of the p-type MIS transistor's substrate contact portion 806, and an n-type doped layer 803a is formed in the surface portion of a part of the n-type gate electrode 803 that is not covered with the protective film 83. A p-type doped layer (a p-type substrate contact region) 807a is formed in the surface portion of the n-type MIS transistor's substrate contact portion 807, and a p-type doped layer 804a is formed in the surface portion of a part of the p-type gate electrode 804 that is not covered with the protective film 83.

Furthermore, as shown in FIGS. 12A and 12B, an insulating sidewall spacer 805 is formed on the side walls of the n-type gate electrode 803 and p-type gate electrode 804. Also, contact areas 808 for establishing contact with upper-level interconnects and the like are provided on the n-type MIS transistor's active region 801a, the p-type MIS transistor's active region 801b, the p-type MIS transistor's substrate contact portion 806, and the n-type MIS transistor's substrate contact portion 807.

In the semiconductor device of this embodiment shown in FIGS. 12A and 12B, the length K4 of a part of the n-type gate electrode 803 that protrudes from the n-type MIS transistor's active region 801a toward the n-type MIS transistor's substrate contact portion 807 is set equal to the length L4 of a part of the p-type gate electrode 804 that protrudes from the p-type MIS transistor's active region 801b toward the p-type MIS transistor's substrate contact portion 806.

Furthermore, in fabricating the semiconductor device of this embodiment shown in FIGS. 12A and 12B, it is possible to freely set the width (the p-type impurity introducing mask width) K2 of a mask opening area K3, through which a p-type impurity is introduced into the n-type MIS transistor's substrate contact portion 807, and the width (the n-type impurity introducing mask width) L2 of a mask opening area L3, through which an n-type impurity is introduced into the p-type MIS transistor's substrate contact portion 806.

Also, in fabricating the semiconductor device of this embodiment shown in FIGS. 12A and 12B, it is possible to freely set the distance K1 between the n-type MIS transistor's active region 801a and the mask opening area K3, through which a p-type impurity is introduced into the n-type MIS transistor's substrate contact portion 807, and the distance L1 between the p-type MIS transistor's active region 801b and the mask opening area L3, through which an n-type impurity is introduced into the p-type MIS transistor's substrate contact portion 806. That is, it is possible to freely set the distance K5 from the n-type MIS transistor's active region 801a to the n-type MIS transistor's substrate contact portion 807 (the p-type doped layer 807a), and the distance L5 from the p-type MIS transistor's active region 801b to the p-type MIS transistor's substrate contact portion 806 (the n-type doped layer 806a).

In this embodiment, the protective film 83 is formed on the protruding part of the p-type gate electrode 804. Thus, when the n-type doped layer 806a in the p-type MIS transistor's substrate contact portion 806 is formed, the n-type impurity is not introduced into the protruding part of the p-type gate electrode 804. In the p-type MIS transistor, therefore, the influence of interdiffusion occurring due to the substrate contact portion 806 is eliminated.

Also, in this embodiment, the protective film 83 is formed on the protruding part of the n-type gate electrode 803. Thus, when the p-type doped layer 807a in the n-type MIS transistor's substrate contact portion 807 is formed, the p-type impurity is not introduced into the protruding part of the n-type gate electrode 803. That is, in this embodiment, the impurity of the opposite conductivity type is not introduced into each of the n-type and p-type gate electrodes 803 and 804. It is therefore possible to sufficiently shrink not only the n-type MIS transistor's substrate contact portion 807 but also the p-type MIS transistor's substrate contact portion 806. Thus, even when the logic cells have a limitation on their height, for example, the transistors' active regions are of sufficient size.

Now, it will be described how to fabricate a semiconductor device according to the sixth embodiment of the present invention. FIGS. 13A, 15A, 17A, 18A, and 19A are plan views illustrating process steps for fabricating the semiconductor device of this embodiment. FIGS. 13B, 14A to 14C, 15B, 16A to 16C, 17B, 18B, and 19B are cross-sectional views illustrating the process steps for fabricating the semiconductor device of this embodiment. FIG. 13B is a cross-sectional view taken along the line XIII-XIII in FIG. 13A. FIG. 15B is a cross-sectional view taken along the line XV-XV in FIG. 15A. FIG. 17B is a cross-sectional view taken along the line XVII-XVII in FIG. 17A. FIG. 18B is a cross-sectional view taken along the line XVIII-XVIII in FIG. 18A. FIG. 19B is a cross-sectional view taken along the line XIX-XIX in FIG. 19A.

Figure 13A:
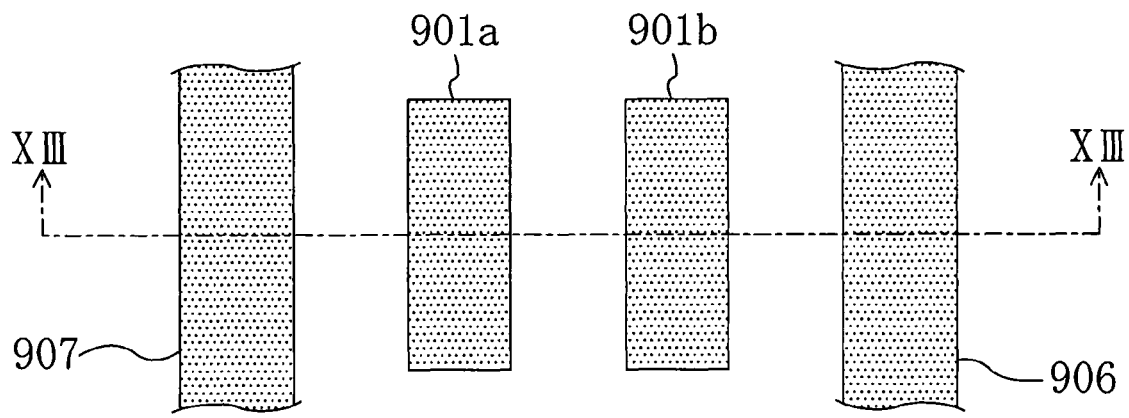
FIG. 13A is a plan view illustrating a process step for fabricating the dual-gate semiconductor device of the sixth embodiment of the present invention.
Figure 13B:
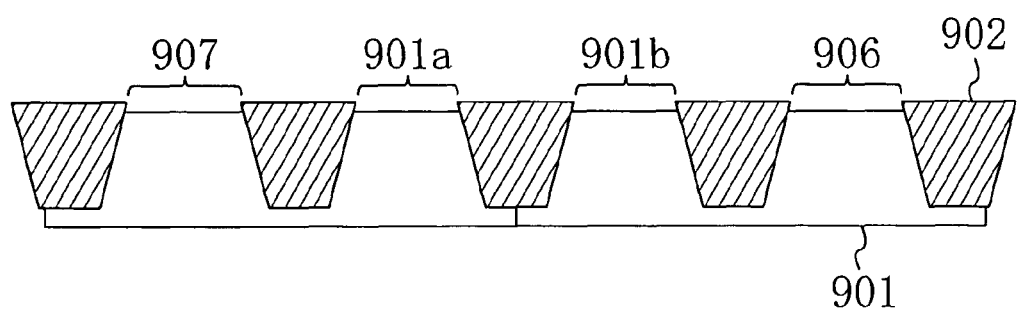
FIG. 13B is a cross-sectional view taken along the line XIII-XIII in FIG. 13A.

First, as shown in FIGS. 13A and 13B, an active region 901a of an n-type MIS transistor (hereinafter referred to as the n-type MIS transistor's active region 901a) and an active region of 901b of a p-type MIS transistor (hereinafter referred to as the p-type MIS transistor's active region 901b) are formed on a semiconductor substrate 901 made of silicon so as to be adjacent to each other with an isolation region 902 interposed therebetween. A substrate contact portion 907 of the n-type MIS transistor (hereinafter referred to as the n-type MIS transistor's substrate contact portion 907) is formed on the semiconductor substrate 901 opposite the p-type MIS transistor's active region 901b with respect to the n-type MIS transistor's active region 901a, while a substrate contact portion 906 of the p-type MIS transistor (hereinafter referred to as the p-type MIS transistor's substrate contact portion 906) is formed on the semiconductor substrate 901 opposite the n-type MIS transistor's active region 901a with respect to the p-type MIS transistor's active region 901b. The isolation region 902 is formed also between the n-type MIS transistor's active region 901a and the n-type MIS transistor's substrate contact portion 907 and between the p-type MIS transistor's active region 901b and the p-type MIS transistor's substrate contact portion 906.

Figure 14A:
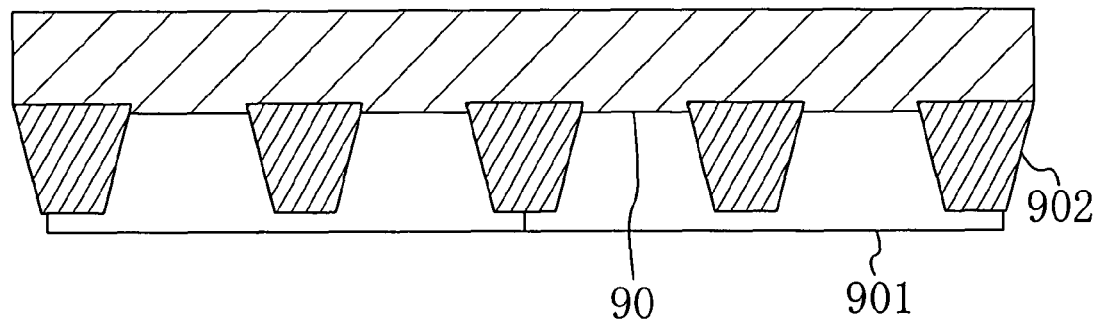
FIGS. 14A to 14C are cross-sectional views illustrating process steps for fabricating the dual-gate semiconductor device of the sixth embodiment of the present invention.
Figure 14B:
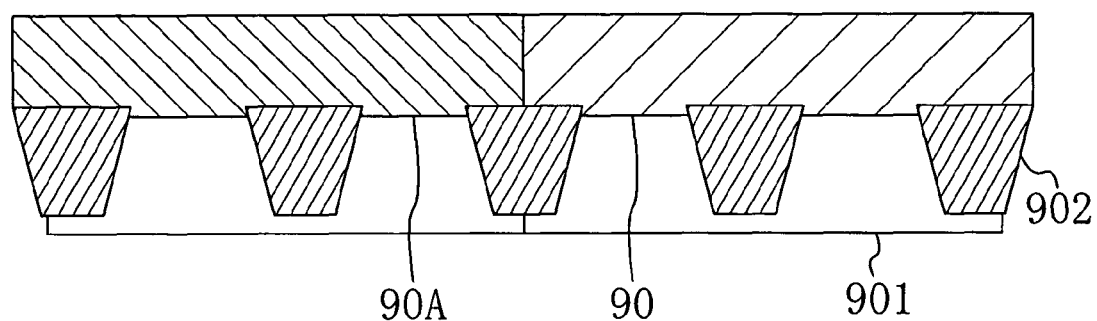
Figure 14C:
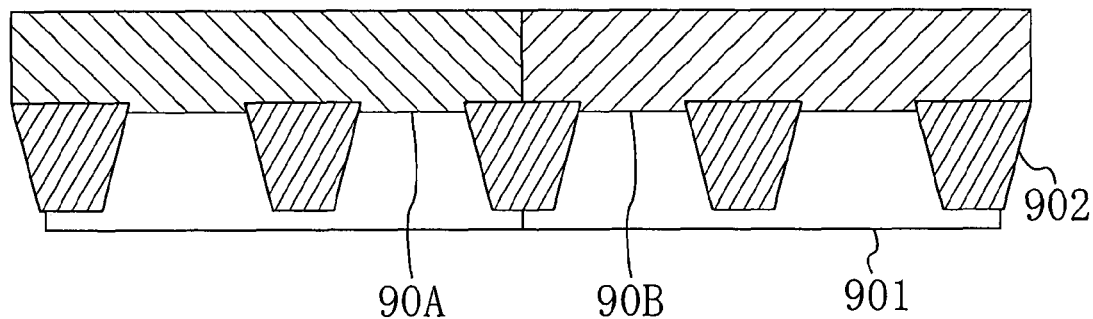

Next, as shown in FIG. 14A, a gate electrode formation conductive film 90 is formed over the semiconductor substrate 901 with a gate insulating film (not shown) interposed therebetween. Then, as shown in FIG. 14B, ions of an n-type impurity, e.g., phosphorus ions, are implanted into a part of the gate electrode formation conductive film 90 located in the n-type MIS transistor region at an acceleration voltage of 6 keV, at a dose of $6.0\times10^{15}$ ions/cm$^2$, and at a tilt angle of 0°, thereby forming an n-type gate electrode layer 90A. Subsequently, as shown in FIG. 14C, ions of a p-type impurity, e.g., boron ions, are implanted into a part of the gate electrode formation conductive film 90 located in the p-type MIS transistor region at an acceleration voltage of 2 keV, at a dose of $2.0\times10^{15}$ ions/cm$^2$, and at a tilt angle of 0°, thereby forming a p-type gate electrode layer 90B.

Figure 15A:
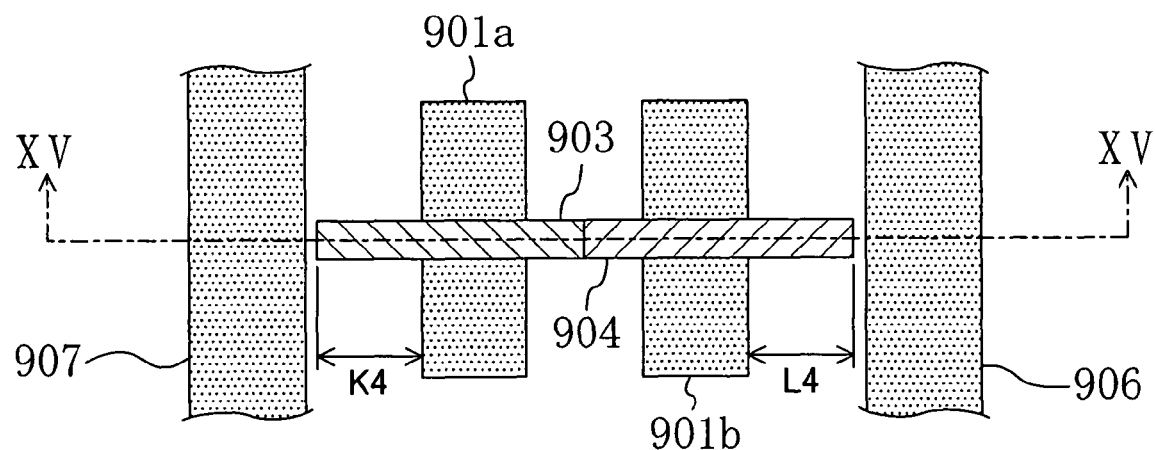
FIG. 15A is a plan view illustrating a process step for fabricating the dual-gate semiconductor device of the sixth embodiment of the present invention.
Figure 15B:
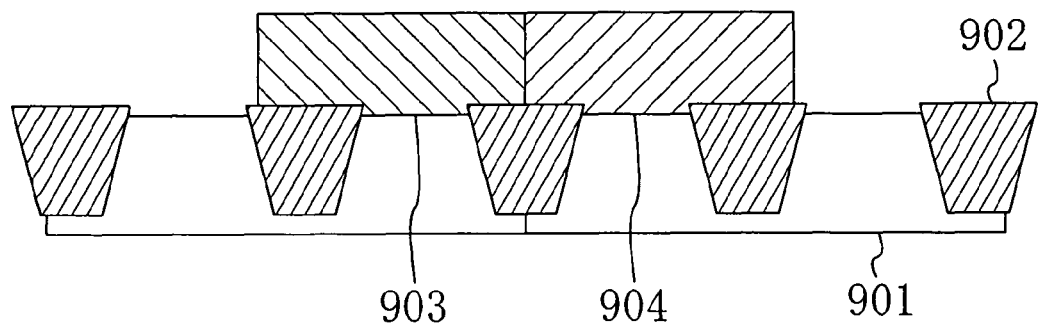
FIG. 15B is a cross-sectional view taken along the line XV-XV in FIG. 15A.

Next, as shown in FIGS. 15A and 15B, the n-type gate electrode layer 90A and the p-type gate electrode layer 90B are each patterned by etching, whereby an n-type gate electrode 903, into which the n-type impurity has been introduced, is formed over the n-type MIS transistor's active region 901a, and a p-type gate electrode 904, into which the p-type impurity has been introduced, is formed over the p-type MIS transistor's active region 901b. In this process step, the n-type gate electrode 903 and the p-type gate electrode 904 are formed so as to be connected together on the isolation region 902 located between the n-type MIS transistor's active region 901a and the p-type MIS transistor's active region 901b. The length K4 of a part of the n-type gate electrode 903 that protrudes from the n-type MIS transistor's active region 901a toward the n-type MIS transistor's substrate contact portion 907 is set equal to the length L4 of a part of the p-type gate electrode 904 that protrudes from the p-type MIS transistor's active region 901b toward the p-type MIS transistor's substrate contact portion 906.

Then, arsenic ions, for example, are implanted into the n-type MIS transistor's active region 901a and into the substrate contact portion 907 at an acceleration voltage of 3 keV, at a dose of $1.5\times10^{15}$ ions/cm$^2$, and at a tilt angle of 0°, thereby forming an n-type extension region (not shown). Next, a 4-way rotation implantation of, e.g., boron ions into the n-type MIS transistor's active region 901a and into the substrate contact portion 907 is performed at an acceleration voltage of 10 keV, at a dose of $8.0\times10^{12}$ ions/cm$^2$, and at a tilt angle of 25°, thereby forming a p-type pocket region (not shown).

Next, boron ions, for example, are implanted into the p-type MIS transistor's active region 901b and into the substrate contact portion 906 at an acceleration voltage of 0.5 keV, at a dose of $3.0\times10^{14}$ ions/cm$^2$, and at a tilt angle of 0°, thereby forming a p-type extension region (not shown). Then, a 4-way rotation implantation of, e.g., phosphorus ions into the p-type MIS transistor's active region 901b and into the substrate contact portion 906 is performed at an acceleration voltage of 30 keV, at a dose of $7.0\times10^{12}$ ions/cm$^2$, and at a tilt angle of 25°, thereby forming an n-type pocket region (not shown).

Figure 16A:
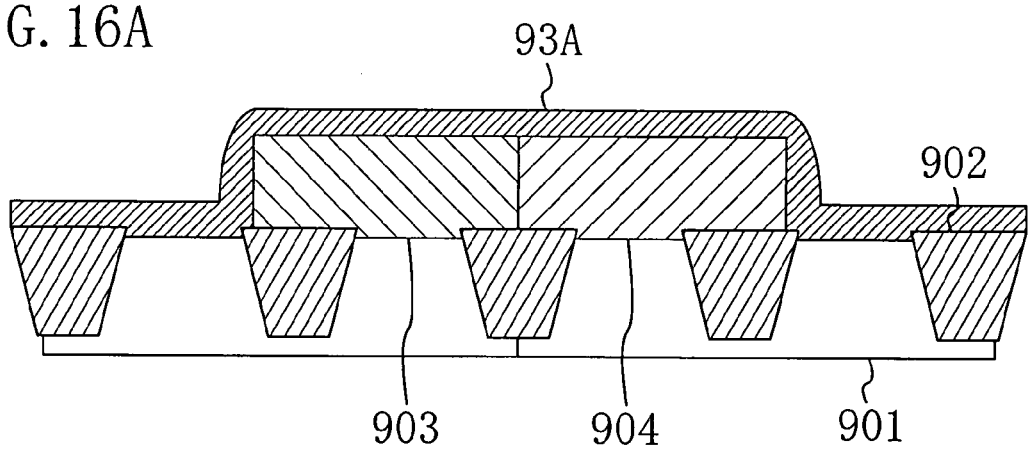
FIGS. 16A to 16C are cross-sectional views illustrating process steps for fabricating the dual-gate semiconductor device of the sixth embodiment of the present invention.
Figure 16B:
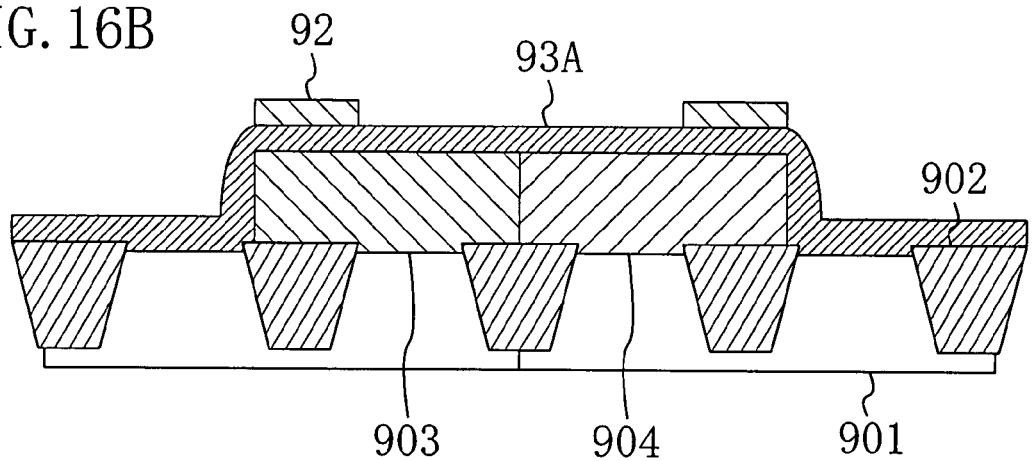
Figure 16C:
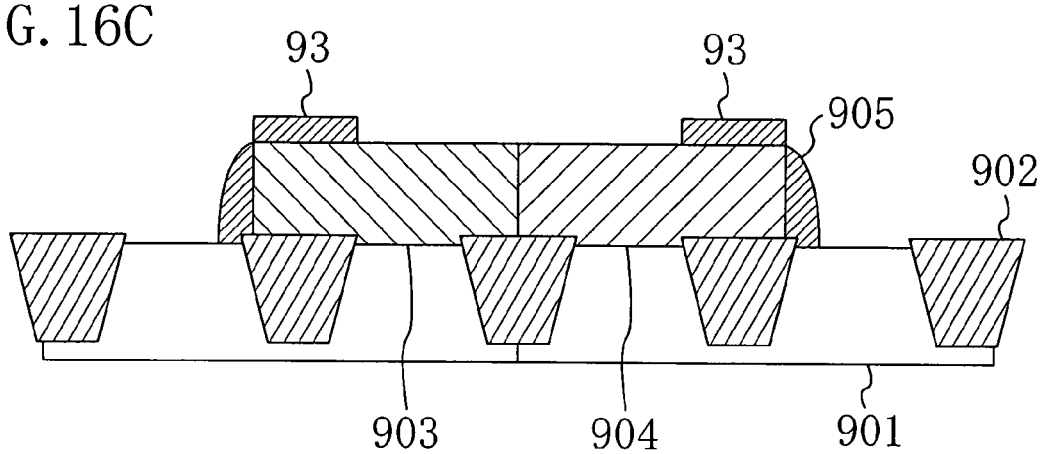

Next, as shown in FIG. 16A, an insulating film 93A made, e.g., of a silicon nitride film is formed over the semiconductor substrate 901 as well as over the n-type gate electrode 903 and the p-type gate electrode 904. Then, as shown in FIG. 16B, mask films 92 are formed, which cover parts of the insulating film 93A located on the respective protruding parts (see FIG. 15A) of the n-type and p-type gate electrodes 903 and 904. The insulating film 93A is then etched back using the mask films 92, whereby, as shown in FIG. 16C, a sidewall spacer 905 made of the insulating film 93A is formed on the side walls of the n-type and p-type gate electrodes 903 and 904, while, at the same time, protective films 93 made of the insulating film 93A are formed on the respective protruding parts of the n-type and p-type gate electrodes 903 and 904. Thereafter, the mask films 92 are removed.

Figure 17A:
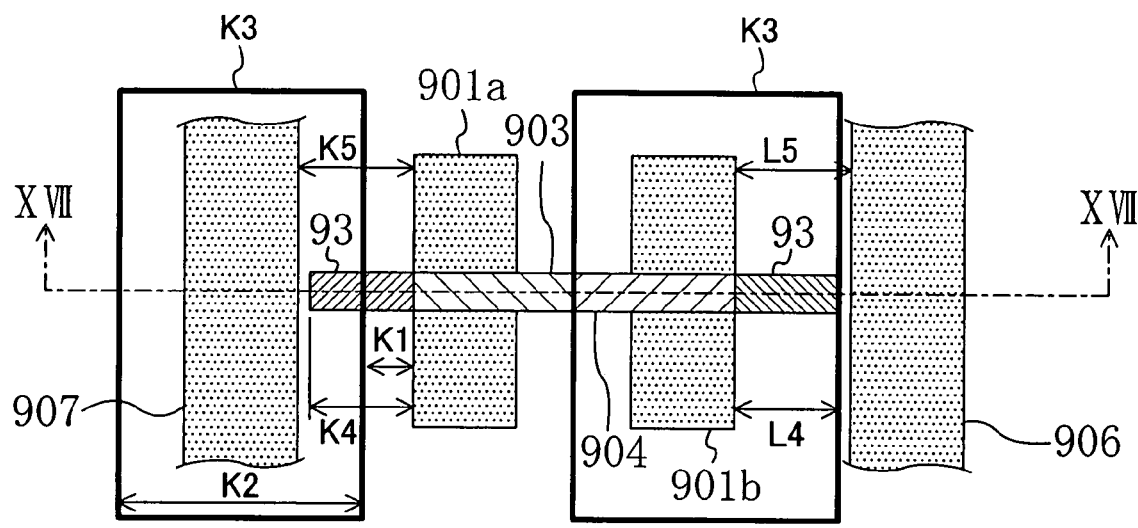
FIG. 17A is a plan view illustrating a process step for fabricating the dual-gate semiconductor device of the sixth embodiment of the present invention.
Figure 17B:
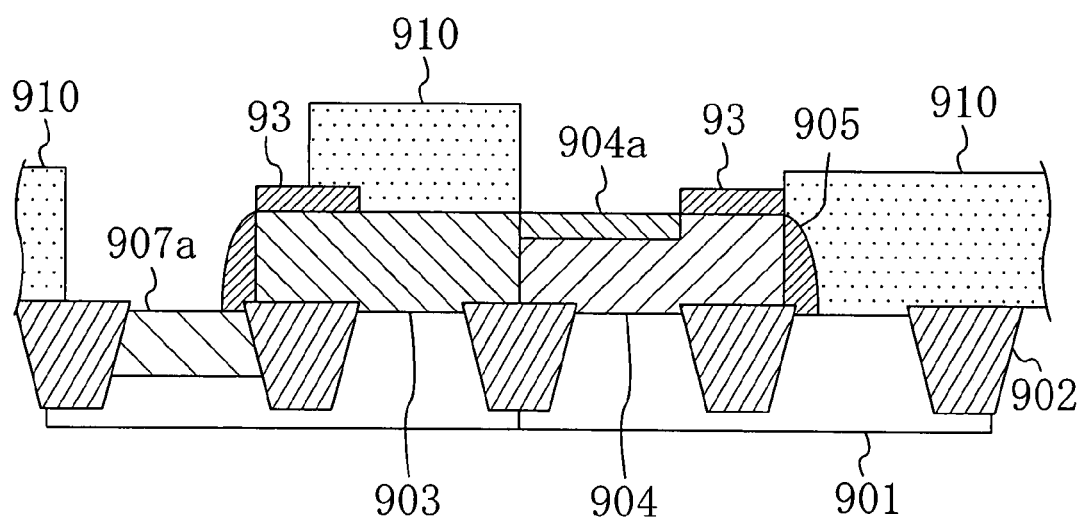
FIG. 17B is a cross-sectional view taken along the line XVII-XVII in FIG. 17A.

Next, as shown in FIGS. 17A and 17B, boron ions, for example, are implanted into the semiconductor substrate 901 at an acceleration voltage of 2 keV, at a dose of $4.0\times10^{15}$ ions/cm$^2$, and at a tilt angle of 7° with a resist pattern 910 used as a mask, which has opening areas (p-type impurity introducing areas) K3 over the p-type MIS transistor's active region 901b and over the n-type MIS transistor's substrate contact portion 907. By this step, p-type source/drain regions (not shown) are formed in the p-type MIS transistor's active region 901b, while a p-type doped layer (a p-type substrate contact region) 907a is formed in the n-type MIS transistor's substrate contact portion 907. At this time, a p-type doped layer 904a is formed in the part of the surface portion of the p-type-impurity-introduced p-type gate electrode 904 that is not covered with the protective film 93. In this embodiment, since the surface portion of the protruding part of the n-type-impurity-introduced n-type gate electrode 903 is covered with the protective film 93, the p-type impurity is not introduced into the protruding part of the n-type gate electrode 903. Also, in this embodiment, the width K2 of the p-type impurity introducing area K3 over the n-type MIS transistor's substrate contact portion 907, and the distance K1 between the n-type MIS transistor's active region 901a and that p-type impurity introducing area K3 (i.e., the distance. K5 from the n-type MIS transistor's active region 901a to the n-type MIS transistor's substrate contact portion 907 (the p-type doped layer 907a)), can be set to any values.

Figure 18A:
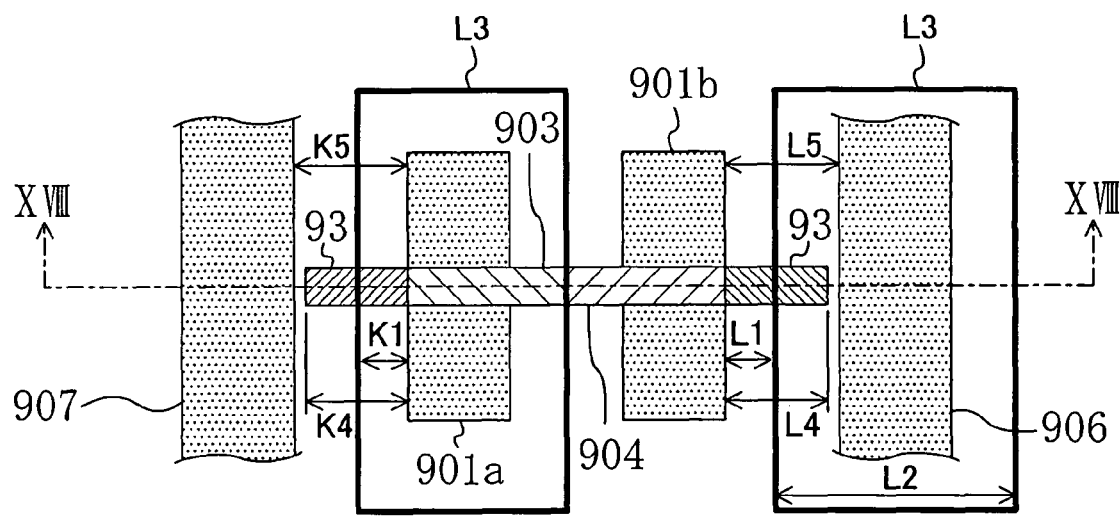
FIG. 18A is a plan view illustrating a process step for fabricating the dual-gate semiconductor device of the sixth embodiment of the present invention.
Figure 18B:
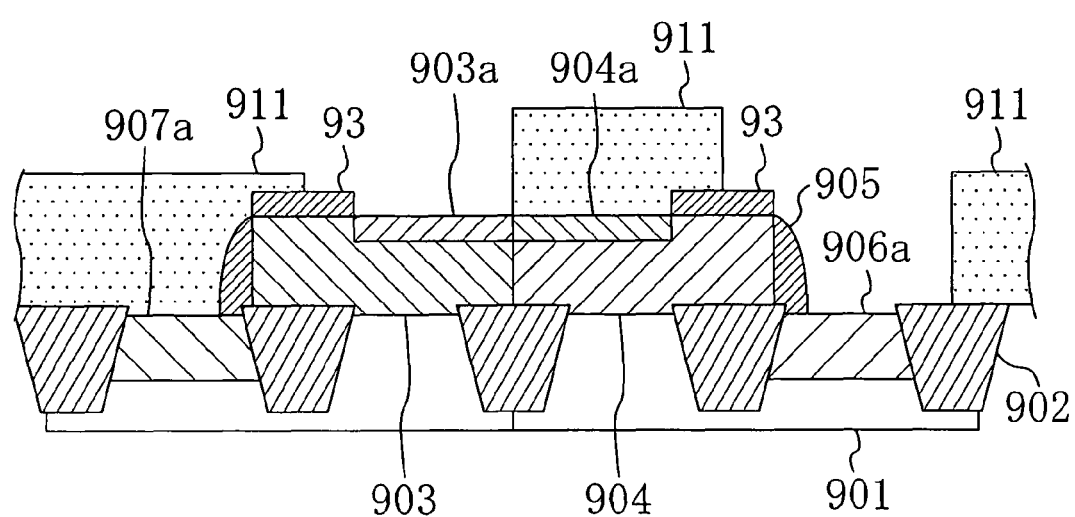
FIG. 18B is a cross-sectional view taken along the line XVIII-XVIII in FIG. 18A.

Next, the resist pattern 910 is removed, and then as shown in FIGS. 18A and 18B, arsenic ions, for example, are implanted into the semiconductor substrate 901 at an acceleration voltage of 20 keV, at a dose of $4.0\times10^{15}$ ions/cm$^2$, and at a tilt angle of 0° with a resist pattern 911 used as a mask, which has opening areas (n-type impurity introducing areas) L3 over the n-type MIS transistor's active region 901a and over the p-type MIS transistor's substrate contact portion 906. Subsequently, phosphorus ions, for example, are implanted into the semiconductor substrate 901 at an acceleration voltage of 10 keV, at a dose of $1.0\times10^{15}$ ions/cm$^2$, and at a tilt angle of 7°. By these ion implantations, n-type source/drain regions (not shown) are formed in the n-type MIS transistor's active region 901a, while an n-type doped layer (an n-type substrate contact region) 906a is formed in the p-type MIS transistor's substrate contact portion 906. At this time, an n-type doped layer 903a is formed in the part of the surface portion of the n-type-impurity-introduced n-type gate electrode 903 that is not covered with the protective film 93. In this embodiment, since the surface portion of the protruding part of the p-type-impurity-introduced p-type gate electrode 904 is covered with the protective film 93, the n-type impurities are not introduced into the protruding part of the p-type gate electrode 904. Also, in this embodiment, the width L2 of the n-type impurity introducing area L3 over the p-type MIS transistor's substrate contact portion 906, and the distance L1 between the p-type MIS transistor's active region 901b and that n-type impurity introducing area L3 (i.e., the distance L5 from the p-type MIS transistor's active region 901b to the p-type MIS transistor's substrate contact portion 906 (the n-type doped layer 906a)), can be set to any values.

Figure 19A:
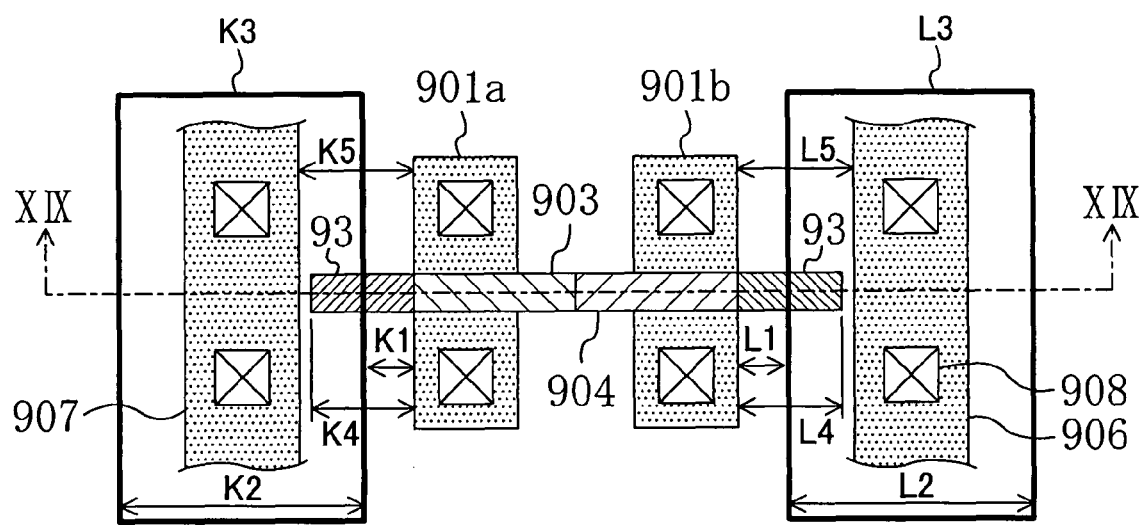
FIG. 19A is a plan view illustrating a process step for fabricating the dual-gate semiconductor device of the sixth embodiment of the present invention.
Figure 19B:
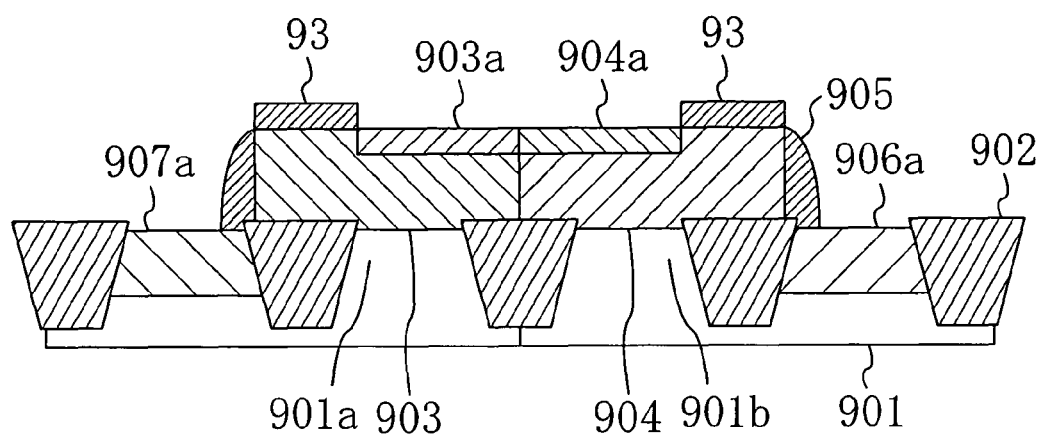
FIG. 19B is a cross-sectional view taken along the line XIX-XIX in FIG. 19A.
Figure 20A:
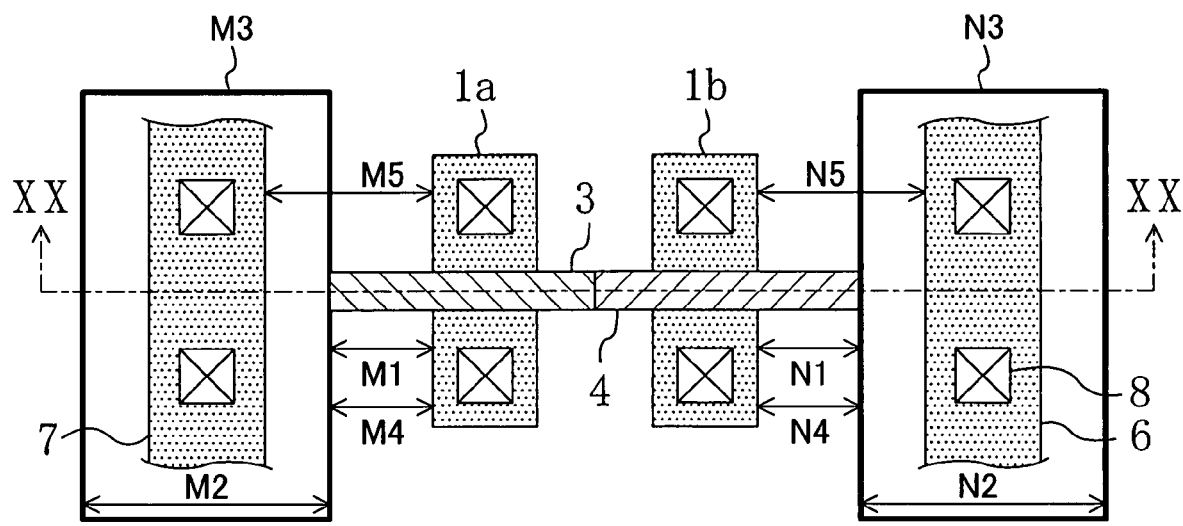
FIG. 20A is a plan view of a conventional semiconductor device having a dual-gate structure.
Figure 20B:
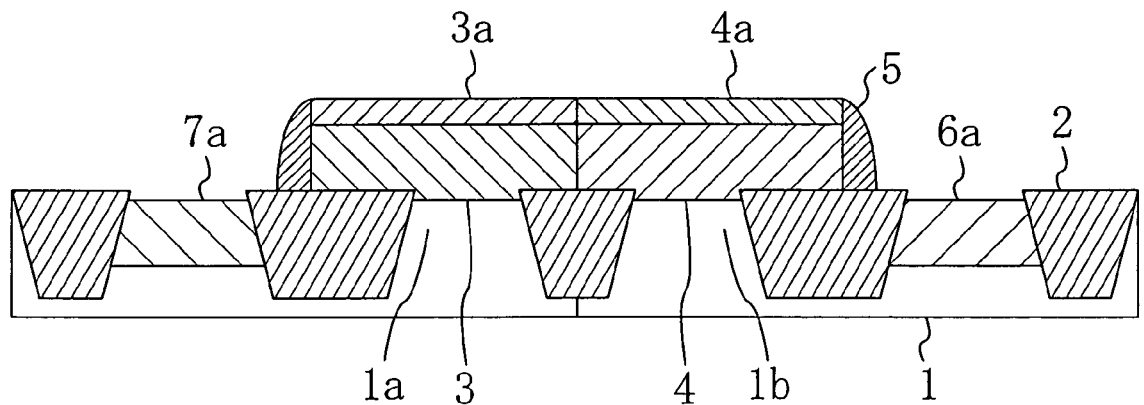
FIG. 20B is a cross-sectional view taken along the line XX-XX in FIG. 20A.

Subsequently, the resist pattern 911 is removed. Thereafter, as shown in FIGS. 19A and 19B, contact areas (contact plugs) 908 for establishing contact with upper-level interconnects and the like are formed on the n-type MIS transistor's active region 901a, the p-type MIS transistor's active region 901b, the p-type MIS transistor's substrate contact portion 906, and the n-type MIS transistor's substrate contact portion 907.

In the above-described method of this embodiment, the protective film 93 is formed on the protruding part of the p-type gate electrode 904. Thus, when the n-type impurities are introduced into the p-type MIS transistor's substrate contact portion 906, the n-type impurities are not introduced into the protruding part of the p-type gate electrode 904. In the p-type MIS transistor, therefore, the influence of interdiffusion occurring due to the substrate contact portion 906 is eliminated.

Also, in the method of this embodiment, the protective film 93 is formed on the protruding part of the n-type gate electrode 903. When the p-type impurity is introduced into the n-type MIS transistor's substrate contact portion 907, the p-type impurity is thus not introduced into the protruding part of the n-type gate electrode 903. That is, in this embodiment, the impurity of the opposite conductivity type is not introduced into each of the n-type and p-type gate electrodes 903 and 904. It is therefore possible to sufficiently shrink not only the n-type MIS transistor's substrate contact portion 907 but also the p-type MIS transistor's substrate contact portion 906. Thus, even when the logic cells have a limitation on their height, for example, the transistors' active regions are of sufficient size.

In this embodiment, the protective film does not necessarily have to be formed on the protruding part of the n-type gate electrode.

Also, in this embodiment, after the n-type impurities are introduced into the p-type MIS transistor's substrate contact portion, the protective film on the protruding part of the p-type gate electrode may be removed. Likewise, after the p-type impurity is introduced into the n-type MIS transistor's substrate contact portion, the protective film on the protruding part of the n-type gate electrode may be removed.

Furthermore, in this embodiment, the protective films are formed on the respective protruding parts of the p-type and n-type gate electrodes by using the sidewall spacer formation insulating film. However, it will easily be appreciated that the protective film formation method is not limited to any particular method.

The present invention described in the scope of the appended claims is not limited to the embodiments described above.

What is claimed is:

1. A semiconductor device having a dual-gate structure, the device comprising:
a first active region of an n-type MIS transistor and a second active region of a p-type MIS transistor formed on a semiconductor substrate so as to be adjacent to each other with a first isolation region interposed therebetween;
a first substrate contact portion of the n-type MIS transistor formed on the semiconductor substrate near the first active region;
a second substrate contact portion of the p-type MIS transistor formed on the semiconductor substrate near the second active region;
an n-type gate electrode formed over the first active region and containing an n-type impurity introduced thereinto;
a first p-type doped layer formed in the first substrate contact portion and containing a p-type impurity introduced thereinto;
a p-type gate electrode formed over the second active region and containing a p-type impurity introduced thereinto;
a first n-type doped layer formed in the second substrate contact portion and containing an n-type impurity introduced thereinto;
a second p-type doped layer formed in a protruding part of the n-type gate electrode, where the n-type gate electrode protrudes from the first active region toward the first substrate contact portion and containing a p-type impurity introduced thereinto; and
a second n-type doped layer formed in a protruding part of the p-type gate electrode, where the p-type gate electrode protrudes from the second active region toward the second substrate contact portion and containing a n-type impurity introduced thereinto,
wherein the first active region and the first substrate contact portion are separated by a second isolation region located between the first active region and the first substrate contact portion,
the second active region and the second substrate contact portion are separated by a third isolation region located between the second active region and the second substrate contact portion,
a distance between the second substrate contact portion and the second active region is greater than a distance between the first substrate contact portion and the first active region, and
a width of the second n-type doped layer in the gate width direction is smaller than a width of the second p-type doped layer in the gate width direction.

2. The semiconductor device of claim 1, wherein
the length of the protruding part of the n-type gate electrode in the gate width direction that protrudes from the first active region toward the first substrate contact portion on the second isolation region is set equal to the length of the protruding part of the p-type gate electrode in the gate width direction that protrudes from the second active region toward the second substrate contact portion on the third isolation region.

3. The semiconductor device of claim 1, wherein
a distance between the first substrate contact portion and the n-type gate electrode is shorter than a distance between the second substrate contact portion and the p-type gate electrode.

4. The semiconductor device of claim 1, wherein
a width of the first active region in the gate length direction is smaller than a width of the first substrate contact portion in the gate length direction, and
a width of the second active region in the gate length direction is smaller than a width of the second substrate contact portion in the gate length direction.

5. The semiconductor device of claim 1, further comprising:
a first insulating sidewall spacer formed on a sidewall of the n-type gate electrode located near the first substrate contact portion; and
a second insulating sidewall spacer formed on a sidewall of the p-type gate electrode located near the second substrate contact portion, wherein
the first insulating sidewall spacer is extended in the direction from the second isolation region to the first substrate contact portion, and
the second insulating sidewall spacer is not formed on the second substrate contact portion, and is formed only on the third isolation region.

6. A semiconductor device having a dual-gate structure, the device comprising:
a first active region of an n-type MIS transistor and a second active region of a p-type MIS transistor formed on a semiconductor substrate so as to be adjacent to each other with a first isolation region interposed therebetween;

a first substrate contact portion of the n-type MIS transistor formed on the semiconductor substrate near the first active region;

a second substrate contact portion of the p-type MIS transistor formed on the semiconductor substrate near the second active region;

an n-type gate electrode formed over the first active region and containing an n-type impurity introduced thereinto;

a p-type doped layer formed in the first substrate contact portion and containing a p-type impurity introduced thereinto;

a p-type gate electrode formed over the second active region and containing a p-type impurity introduced thereinto;

an n-type doped layer formed in the second substrate contact portion and containing an n-type impurity introduced thereinto;

a second p-type doped layer formed in a protruding part of the n-type gate electrode, where the n-type gate electrode protrudes from the first active region toward the first substrate contact portion and containing a p-type impurity introduced thereinto; and a second n-type doped layer formed in a protruding part of the p-type gate electrode, where the p-type gate electrode protrudes from the second active region toward the second substrate contact portion and containing a n-type impurity introduced thereinto, wherein the first active region and the first substrate contact portion are separated by a second isolation region located between the first active region and the first substrate contact portion, the second active region and the second substrate contact portion are separated by a third isolation region located between the second active region and the second substrate contact portion, the length of a protruding part of the p-type gate electrode in the gate width direction that protrudes from the second active region toward the second substrate contact portion on the third isolation region is shorter than the length of a protruding part of the n-type gate electrode in the gate width direction that protrudes from the first active region toward the first substrate contact portion on the second isolation region, and a width of the second n-type doped layer in the gate width direction is smaller than a width of the second p-type doped layer in the gate width direction.

7. The semiconductor device of claim 6, wherein the distance between the second substrate contact portion and the second active region is set equal to the distance between the first substrate contact portion and the first active region.

8. The semiconductor device of claim 6, wherein
a distance between the first substrate contact portion and the n-type gate electrode is shorter than a distance between the second substrate contact portion and the p-type gate electrode.

9. The semiconductor device of claim 6, wherein
a width of the first active region in the gate length direction is smaller than a width of the first substrate contact portion in the gate length direction, and
a width of the second active region in the gate length direction is smaller than a width of the second substrate contact portion in the gate length direction.

10. The semiconductor device of claim 6, further comprising:
a first insulating sidewall spacer formed on a sidewall of the n-type gate electrode located near the first substrate contact portion; and a second insulating sidewall spacer formed on a sidewall of the p-type gate electrode located near the second substrate contact portion, wherein
the first insulating sidewall spacer is extended in the direction from the second isolation region to the first substrate contact portion, and
the second insulating sidewall spacer is not formed on the second substrate contact portion, and is formed only on the third isolation region.

11. A semiconductor device having a dual-gate structure, the device comprising:
a first active region of an n-type MIS transistor and a second active region of a p-type MIS transistor formed on a semiconductor substrate so as to be adjacent to each other with a first isolation region interposed therebetween;

a first substrate contact portion of the n-type MIS transistor formed on the semiconductor substrate near the first active region;

a second substrate contact portion of the p-type MIS transistor formed on the semiconductor substrate near the second active region;

an n-type gate electrode formed over the first active region and containing an n-type impurity introduced thereinto;

a first p-type doped layer formed in the first substrate contact portion and containing a p-type impurity introduced thereinto;

a p-type gate electrode formed over the second active region and containing a p-type impurity introduced thereinto; and a first n-type doped layer formed in the second substrate contact portion and containing an n-type impurity introduced thereinto, wherein the first active region and the first substrate contact portion are separated by a second isolation region located between the first active region and the first substrate contact portion, the second active region and the second substrate contact portion are separated by a third isolation region located between the second active region and the second substrate contact portion, a distance between the second substrate contact portion and the second active region is greater than a distance between the first substrate contact portion and the first active region, a width of the first active region in the gate length direction is smaller than a width of the first substrate contact portion in the gate length direction, and a width of the second active region in the gate length direction is smaller than a width of the second substrate contact portion in the gate length direction.

12. The semiconductor device of claim 11, wherein
the length of a protruding part of the n-type gate electrode in the gate width direction that protrudes from the first active region toward the first substrate contact portion on the second isolation region is set equal to the length of a protruding part of the p-type gate electrode in the gate width direction that protrudes from the second active region toward the second substrate contact portion on the third isolation region.

13. The semiconductor device of claim 11, wherein
a distance between the first substrate contact portion and the n-type gate electrode is shorter than a distance between the second substrate contact portion and the p-type gate electrode.

14. The semiconductor device of claim 11, further comprising:
- a first insulating sidewall spacer formed on a sidewall of the n-type gate electrode located opposite the first substrate contact portion; and
- a second insulating sidewall spacer formed on a sidewall of the p-type gate electrode located opposite the second substrate contact portion, wherein
- the first insulating sidewall spacer is extended in the direction from the second isolation region to the first substrate contact portion, and
- the second insulating sidewall spacer is not formed on the second substrate contact portion, and is formed only on the third isolation region.

15. A semiconductor device having a dual-gate structure, the device comprising:
- a first active region of an n-type MIS transistor and a second active region of a p-type MIS transistor formed on a semiconductor substrate so as to be adjacent to each other with a first isolation region interposed therebetween;
- a first substrate contact portion of the n-type MIS transistor formed on the semiconductor substrate near the first active region;
- a second substrate contact portion of the p-type MIS transistor formed on the semiconductor substrate near the second active region;
- an n-type gate electrode formed over the first active region and containing an n-type impurity introduced thereinto;
- a p-type doped layer formed in the first substrate contact portion and containing a p-type impurity introduced thereinto;
- a p-type gate electrode formed over the second active region and containing a p-type impurity introduced thereinto; and
- an n-type doped layer formed in the second substrate contact portion and containing an n-type impurity introduced thereinto,
- wherein the first active region and the first substrate contact portion are separated by a second isolation region located between the first active region and the first substrate contact portion,
- the second active region and the second substrate contact portion are separated by a third isolation region located between the second active region and the second substrate contact portion,
- the length of a protruding part of the p-type gate electrode in the gate width direction that protrudes from the second active region toward the second substrate contact portion on the third isolation region is shorter than the length of a protruding part of the n-type gate electrode in the gate width direction that protrudes from the first active region toward the first substrate contact portion on the second isolation region,
- a width of the first active region in the gate length direction is smaller than a width of the first substrate contact portion in the gate length direction, and
- a width of the second active region in the gate length direction is smaller than a width of the second substrate contact portion in the gate length direction.

16. The semiconductor device of claim 15, wherein a distance between the second substrate contact portion and the second active region is set equal to a distance between the first substrate contact portion and the first active region.

17. The semiconductor device of claim 15, wherein
- a distance between the first substrate contact portion and the n-type gate electrode is shorter than a distance between the second substrate contact portion and the p-type gate electrode.

18. The semiconductor device of claim 15, further comprising:
- a first insulating sidewall spacer formed on a sidewall of the n-type gate electrode located opposite the first substrate contact portion; and
- a second insulating sidewall spacer formed on a sidewall of the p-type gate electrode located opposite the second substrate contact portion, wherein
- the first insulating sidewall spacer is extended in the direction from the second isolation region to the first substrate contact portion, and
- the second insulating sidewall spacer is not formed on the second substrate contact portion, and is formed only on the third isolation region.

* * * * *